(12) United States Patent
Matsuo et al.

(10) Patent No.: US 7,057,896 B2
(45) Date of Patent: Jun. 6, 2006

(54) POWER MODULE AND PRODUCTION METHOD THEREOF

(75) Inventors: Mitsuhiro Matsuo, Osaka (JP); Hiroyuki Handa, Hirakata (JP); Koji Yoshida, Ikoma (JP); Satoshi Ikeda, Suita (JP); Yoshihiro Takeshima, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 290 days.

(21) Appl. No.: 10/639,195

(22) Filed: Aug. 11, 2003

(65) Prior Publication Data

US 2004/0070946 A1    Apr. 15, 2004

(30) Foreign Application Priority Data

Aug. 21, 2002    (JP)    ............................... 2002-241235

(51) Int. Cl.
*H05K 7/20*    (2006.01)

(52) U.S. Cl. ...................... 361/704; 257/706; 257/712; 361/708; 361/710; 361/713; 361/719

(58) Field of Classification Search ........ 257/706–707, 257/712–713; 361/704–710, 712–722
See application file for complete search history.

(56) References Cited

U.S. PATENT DOCUMENTS

| 4,712,160 | A | * | 12/1987 | Sato et al. | .................. 361/710 |
| 5,172,213 | A | * | 12/1992 | Zimmerman | ................ 257/796 |
| 5,398,160 | A | * | 3/1995 | Umeda | ........................ 361/707 |
| 5,608,610 | A | * | 3/1997 | Brzezinski | .................. 361/704 |
| 6,201,696 | B1 | * | 3/2001 | Shimizu et al. | ............. 361/704 |
| 6,282,092 | B1 | * | 8/2001 | Okamoto et al. | ............ 361/704 |
| 6,473,304 | B1 | * | 10/2002 | Stevens | ...................... 361/704 |

FOREIGN PATENT DOCUMENTS

| JP | 03278596 | 12/1991 |
| JP | 09246433 | 9/1997 |

* cited by examiner

*Primary Examiner*—Gregory D Thompson
(74) *Attorney, Agent, or Firm*—Sheridan Ross P.C.

(57) ABSTRACT

A power module of the present invention mounts electronic components and comprises a circuit board that constitutes an electric power conversion circuit along with the above-mentioned electronic components; a heat sink; and a member with insulation characteristics and high thermal conductivity, which is disposed between plural devices with high heating value among the above-mentioned electronic components and the above-mentioned heat sink, embeds at least part of each of the above-mentioned plural devices with high heating value therein and transfers heat from the above-mentioned plural devices with high heating value to the above-mentioned heat sink.

5 Claims, 14 Drawing Sheets

US 7,057,896 B2

POWER MODULE AND PRODUCTION METHOD THEREOF

BACKGROUND OF THE INVENTION

The present invention relates to an on-board type power module.

Recently, in developing electronic equipment that meets demand toward miniaturization in the market, measures for heat dissipation of heating components mounted on a board at high density (ex. electronic components such as semiconductor device) have increasingly become important. Especially in a power module, since insufficient heat dissipation of components can impair reliability of the components, measures for heat dissipation are extremely important in order to suppress temperature rise due to heat generation of power conversion devices mounted at high density and the like.

As measures for heat dissipation, prior art power modules have adopted a forced air-cooling system with fan or a heat transfer cooling system wherein a high thermal conductive heat sink is pressed onto heating components, thereby to efficiently transfer heat from the heating components to the heat sink for cooling them.

Various electronic components requiring heat dissipation such as MOSFET (MOS (metal-oxide semiconductor) field-effect transistor), transformer, choke, IC for power supply circuit and the like are mounted on a circuit board of a power module. These electronic components vary in shape and height, thereby to generate difference in level among them. There are variations in heights of the components themselves as well as mounted heights of the components on the circuit board. For that reason, even if a heat sink is pressed onto plural heating components, it is difficult to bring all components into coherent with the heat sink evenly. Therefore, it is necessary to accommodate difference in level and height among the heating components and bring the electronic components requiring heat dissipation into coherent with the heat sink so as to ensure heat transfer between them.

In order to solve this problem, Patent Publication No. 2536657 describes a prior art electronic apparatus that comprises a heat sink having depressed portions for accommodating components mounted on a multi-layer board depending on positions and heights of the components. The prior art electronic apparatus disclosed in Patent Publication No. 2536657 will be described below. FIG. 19 is a sectional view of the circuit board disclosed in the above-mentioned Patent Publication.

In FIG. 19, conductors 21a are provided with a circuit board 21 in a predetermined pattern. A resistance 22 as an electronic component with high heating value, a cement resistance 23 with especially high heating value, an electrolytic capacitor 26 as an electronic component with low heating value, a power module 27 with high heating value and the like are fixed to the circuit board 21 by soldering 25. A reference numeral 20 denotes a base made of aluminum die cast. The base 20 has depressed portions 20a for inserting the components 22, 23, 26, 27, respectively, depending on position, height and shape thereof so as to make space between the base 20 and each component substantially same.

A copper cover 28 having the same shape as outline of the cement resistance 23 lies between the cement resistance 23 and the depressed portion 20a. A high thermal conductive resin 29 is filled in each space (depressed portion 20a) between the resistance 22, cement resistance 23 and power module 27, respectively, all of which have a high heating value, and the base 20. A heat-insulating resin 30 is filled in the space (depressed portion 20a) between the electrolytic capacitor 26 with low heating value and the base 20.

A reference numeral 31 denotes a terminal part of each component, a reference numeral 32 denotes a nut for electrically bonding the terminal part 31 to the conductor 21a of the circuit board 21, a reference numeral 33 denotes a fastening screw for electrically connecting the terminal part 31 to the conductor 21a of the circuit board 21, and a reference numeral 34 denotes a holding member for holding the circuit board 21 on the base 20.

In other words, the prior art electronic apparatus enables efficient heat transfer, since both the tall and short components with high heating value are adhered to the heat sink evenly.

In the prior art example, however, there causes a problem of complicating configuration of the heat sink. The heat sink must be designed so as to have convexocancave that correspond to any difference in level ranging from large to minute differences in response to the components of various heights that are mounted on the circuit board. A mold for the heat sink with complicated shape is expensive. In the case of highly complicated shaped heat sink, aluminum die cast drawn from the mold needs to be processed thereafter. Thus, it is impossible to design the heat sink until the pattern of the circuit board and components attached thereto have been determined, and production of the mold for the complicated heat sink takes a long time, thereby to cause delay in going on the market. Moreover, once the shape of heat sink has been established, it becomes difficult to change electronic components on the multi-layer board or their positions. These problems have resulted in prolongation of development period and increase in production cost.

An object of the present invention is to provide a power module that has structural characteristics including good heat dissipation, high thermal resistance reliability, low-cost and high productivity.

Another object of the present invention is to provide a power module that efficiently takes heat generated from components of various heights, which are mounted on the circuit board, by use of a multipurpose heat sink or a simple-shaped heat sink.

Another object of the present invention is to provide a lightweight power module due to miniaturization and weight saving of heat dissipation member.

BRIEF SUMMARY OF THE INVENTION

In order to solve the problem, the present invention has a following configuration. A power module in accordance with the present invention from one aspect is a power module that comprises a circuit board that mounts electronic components and constitutes an electric power conversion circuit along with the above-mentioned electronic components; a heat sink; and a member with insulation characteristics and high thermal conductivity, which is disposed between plural devices with high heating value among the above-mentioned electronic components and the above-mentioned heat sink, embeds at least part of each of the above-mentioned plural devices with high heating value therein and transfers heat from the above-mentioned plural devices with high heating value to the above-mentioned heat sink.

The present invention has the effect of achieving a power module that efficiently transfers heat generated from the mounted electronic components requiring heat dissipation to the heat sink via the high heat conductive member (such as resin material). Hence, temperature rise of the components can be suppressed.

According to the present invention, since there is no need to form convexoconcave on the surface of the heat sink depending on shape of the components mounted to the multi-layer board, a cheap multipurpose heat sink (for example, one side has a heat radiating fin and the opposite side is flat) or a simple-shaped heat sink (for example, a shape of folded aluminum plate) can be utilized. Since it is unnecessary to subject the heat sink to any special process, a cheap power module with high productivity can be achieved.

By fixing the cheap heat sink to the heating components having various heights via the high thermal conductive member (such as resin material), heat generated from the components having various heights can be transferred to the heat sink efficiently with high reliability (the components and the high thermal conductive member, as well as the high thermal conductive member and the heat sink are brought into coherent with each other certainly).

There is no need to change shape of the heat sink depending on location, shape and size of the components mounted to the circuit board. Since heat sink design or mold manufacturing do not take long time, development of power module can be facilitated.

The present invention has the effect of achieving a power module that has constitutional characteristics including good heat dissipation, high thermal resistance reliability, low cost and high productivity.

The present invention has the effect of achieving a power module that efficiently takes heat occurring in the components having various heights mounted to the circuit board by use of a multipurpose heat sink or a simple-shaped heat sink.

A power module in accordance with the present invention from another aspect is a power module wherein the above-mentioned member provides space with respect to the above-mentioned circuit board at the part that is not adhered to the above-mentioned electronic components and remains substantially uniform in thickness at the part.

As the electronic components become miniaturized and their mounting becomes densified, there can cause a problem that voids remain at the boundary area between the member and the board, and the electronic components with high heating value do not stick fast to the member adequately due to the voids. According to the present invention, space between the member and the circuit board exists and therefore there is no fear of leaving voids. The present invention has the effect of ensuring adhesiveness between the electronic components with high heating value and the member, thereby to achieve a power module with high reliability.

A power module in accordance with the present invention from another aspect is a power module wherein the above-mentioned heat sink has a depressed portion and the above-mentioned member is filled in the above-mentioned depressed portion.

By flowing the unhardened member (such as resin) into the depressed portion, the heating components can be embedded in the member, while preventing the member from flowing out.

A power module in accordance with the present invention from another aspect is a power module wherein the above-mentioned member has thermosetting resin and inorganic filler as chief ingredients.

By bringing a thermosetting resin composition with high thermal conductivity as the member into coherent with the electronic components, thermal resistance of the electronic components requiring heat dissipation can be reduced. Adhering the high thermal conductive member to the heat sink and unifying them can reduce contact thermal resistance between the member and the heat sink. Hence, it is possible to provide a power module that is excellent in heat dissipation.

A power module in accordance with the present invention from another aspect is a power module wherein a short component in height is mounted to the side of the above-mentioned circuit board, which is opposed to the above-mentioned heat sink.

Hence, it is possible to achieve a thin power module having good heat radiating characteristic. Reducing variation of the components in height makes interval between each component and the heat sink substantially uniform, thereby to enable eliminating deviation in heat dissipation.

A power module in accordance with the present invention from another aspect is a power module wherein both sides of the above-mentioned circuit board have the above-mentioned heat sink and the above-mentioned member respectively. The present invention has the effect of achieving a power module with good heat dissipation at both sides.

A production method of a power module in accordance with the present invention from another aspect is a production method that comprises a mounting step of mounting electronic components to at least a first side; a laminating step of forming a laminated body wherein an unhardened member with insulation characteristics and high thermal conductivity and a heat sink are laminated on the above-mentioned first side of the above-mentioned circuit board; and an adhering step of pressurizing and heating the above-mentioned laminated body, hardening the above-mentioned member and adhering the above-mentioned circuit board, the above-mentioned member and the above-mentioned heat sink to each other.

The present invention has the effect of achieving a power module that has constitutional characteristics including good heat dissipation, high thermal resistance reliability, low cost and high productivity.

The present invention has the effect of achieving a power module that efficiently takes heat occurring in the components having various heights mounted to the circuit board by use of a multipurpose heat sink or a simple-shaped heat sink.

A production method of a power module in accordance with the present invention from another aspect is a production method that comprises a mounting step of mounting electronic components to both sides of a circuit board; a laminating step of forming a laminated body wherein an unhardened member with insulation characteristics and high thermal conductivity and a heat sink are laminated on both sides of the above-mentioned circuit board simultaneously; and an adhering step of pressurizing and heating the above-mentioned laminated body, hardening the above-mentioned member and adhering the above-mentioned circuit board, the above-mentioned member and the above-mentioned heat sink to each other.

The present invention has the effect of achieving a method for producing the power module with good heat dissipation characteristic and high thermal resistance reliability, in which the electronic components are mounted to both sides of the circuit board, at low cost and less steps.

A production method of a power module in accordance with the present invention from another aspect is a production method wherein, in the above-mentioned adhering step, the above-mentioned member provides space with respect to the above-mentioned circuit board at the part that is not adhered to the above-mentioned electronic components and remains uniform in thickness at the part.

Since air remaining within the thermal conductive member comes out of the space between the thermal conductive member and the surface of the circuit board absolutely, no void remains within the member and the electronic components and the thermal conductive member stick fast to each other evenly. The present invention has the effect of achieving a production method with high reliability of power module that efficiently takes heat occurring in the components having various heights, which are mounted to the circuit board.

By applying the present invention to both sides of the circuit board, simultaneous lamination on both sides of the circuit board can be carried out with high reliability.

A production method of a power module in accordance with the present invention from another aspect is a production method, in which the above-mentioned circuit board is a multi-layer board, further comprising a second adhering step of adhering an adhesive thin film to a second side of the above-mentioned circuit board before the above-mentioned adhering step, and a removing step of removing the above-mentioned thin film after the above-mentioned adhering step.

The unhardened member (such as resin) can be prevented from flowing out through the through hole of the multi-layer board.

A production method of a power module in accordance with the present invention from another aspect is a production method that further comprises a second mounting step of mounting a component to the above-mentioned second side of the above-mentioned circuit board after the above-mentioned removing step.

A production method of a power module in accordance with the present invention from another aspect is a production method wherein the above-mentioned heat sink has a depressed portion in the side opposed to the above-mentioned circuit board, and in the above-mentioned laminating step, the above-mentioned unhardened member is filled in the above-mentioned depressed portion and a laminated body wherein the above-mentioned member and the above-mentioned heat sink are laminated is formed on the above-mentioned first side of the above-mentioned circuit board.

The heating components can be embedded in the member, while preventing the member from flowing out.

The novel features of the invention are set forth with particularity in the appended claims. The invention as to both structure and content, and other objects and features thereof will best be understood from the detailed description when considered in connection with the accompanying drawings.

Part or All of the drawings are drawn schematically for diagrammatic representation and it should be considered that they do not necessarily reflect relative size and position of components shown therein.

DETAILED DESCRIPTION OF THE INVENTION

Embodiments that specifically show the best mode for conducting the present invention will be described below with reference to figures.

First Embodiment

A power module in accordance with a first embodiment will be described referring to FIG. 1.

Figure 1:
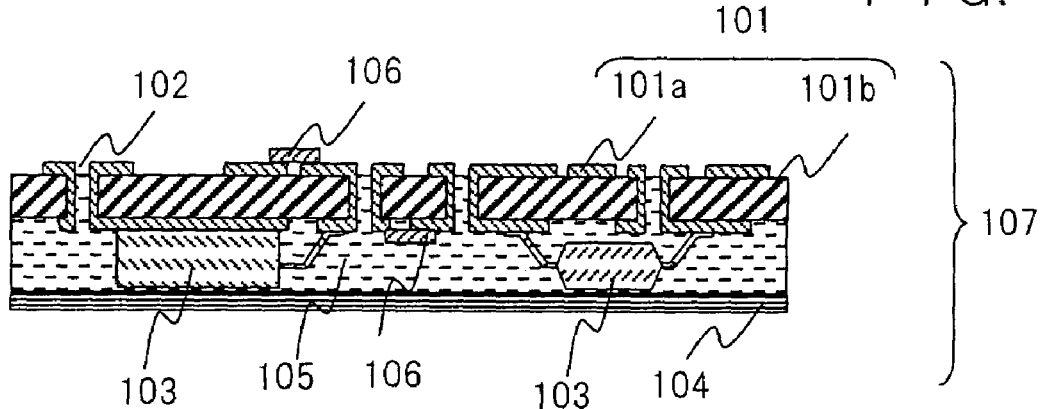
FIG. 1 is a sectional view showing configuration of a power module in accordance with a first embodiment of the present invention.

FIG. 1 is a sectional view showing configuration of the power module in accordance with the first embodiment of the present invention. In FIG. 1, a reference numeral 107 denotes the power module in accordance with the first embodiment of the present invention. The power module 107 comprises a multi-layer board 101 with a through hole 102, electronic components requiring heat dissipation 103

(each having an arbitrary different height), a heat sink 104, a high thermal conductive member 105 and electronic components 106.

The power module of this embodiment consists of three members including the multi-layer board 101, the high thermal conductive member 105 and the heat sink 104. The electronic components 103 and 106 are mounted to an insulating board 101*b* of the multi-layer board 101. The electronic components requiring heat dissipation 103 such as an electric power conversion circuit with power semiconductor device and a control circuit for driving it are disposed on one side of the multi-layer board 101. The high thermal conductive member 105 envelops (embeds) the electronic components requiring heat dissipation 103 therein. The heat sink 104 liberates heat generated from the electronic components requiring heat dissipation 103 to the outside.

Heat occurring in the electronic components requiring heat dissipation 103 is diffused into the high thermal conductive member 105 and after that, the heat is transferred to the heat sink 104 and released from the heat sink 104 into the air.

With the configuration of this embodiment, the heat sink 104 is firmly fixed to one side of the multi-layer board 101, to which the electronic components requiring heat dissipation 103 are mounted, sandwiching the high thermal conductive member 105 therebetween. Heat generated from the electronic components requiring heat dissipation 103 can be thus transferred to the heat sink 104 efficiently.

The multi-layer board 101 comprises the insulating board 101*b* and a conductive circuit pattern 101*a* formed on both sides of the insulating board 101*b*. The conductive circuit pattern 101*a* formed on both sides of the insulating board 101*b* is electrically connected by the through hole 102. The insulating board 101*b* is a, for example, glass-epoxy board in which glass fabric is impregnated with epoxy resin or ceramic board. The multi-layer board 101 of this embodiment is a double-sided board wherein the conductive circuit pattern 101*a* is formed on both sides of the insulating board 101*b* as shown in FIG. 1. The multi-layer board 101 may be a board having more layers or a one-sided board. Electrical connection of the insulating board 101*b* in the thickness direction is achieved by adopting all-layer IVH structure (interstitial via hole structure), not limited to the through hole.

The electronic components requiring heat dissipation 103 are, for example, MOSFET, IGBT (insulated gate bipolar transistor), power semiconductor device such as shot key barrier diode, and passive device such as transistor and resistor.

Preferably, the heat sink is made of aluminum or copper with high thermal conductivity. Copper, in particular, is excellent in thermal conductivity, thereby to obtain a good heat dissipation characteristic. Aluminum is cheap and lightweight, and has high thermal conductivity.

The high thermal conductive member 105 is formed of insulating material that has unhardened thermosetting resin and inorganic filler as chief ingredients. Hence, heat transfer from the heating components 103 to the heat sink 104 can be achieved satisfactorily, resulting in good heat dissipation.

Preferably, the thermosetting resin included in the high thermal conductive member 105 has at least one of epoxy resin, phenolic resin and cyanate resin, all of which have an excellent electrical insulating property even in high temperature. As understood by the fact that epoxy resin, in particular, is widely used as semiconductor sealing material in a circuit board and the like, it is excellent in electrical insulating property as well as chemical resistance and mechanical properties (strength).

Preferably, the inorganic filler has at least one type of powder selected from alumina, silica, magnesia, aluminum nitride and boron nitride. In the case where alumina or aluminum nitride is used as the inorganic filler, thermal conductivity of the high thermal conductive member 105 is further improved. The use of magnesia can increase thermal conductivity and thermal expansion coefficient of the high thermal conductive member 105. And the use of silica (especially amorphous silica) enables the member 105 to save weight and decrease dielectric constant and thermal expansion coefficient. It is preferred that added amount of the inorganic filler makes up about 70 to 95 weight percent of the whole insulating sheet material (high thermal conductive member 105). In the circuit board requiring a good thermal conductivity, it is more preferred that the filled amount of the inorganic filler occupies as high as 88 weight percent or more of the whole member 105. The insulating sheet material 105 is manufactured by technique including, but not limited to, doctor blade method or extrusion method.

In the power module 107, it is preferred that all components mounted to the side of the circuit board, which faces to the heat sink 104, are short in height. By making all components short so as to suppress variation among components in vertical interval, thickness of the high thermal conductive member 105 disposed between the multi-layer board 101 and the heat sink 104 can be reduced. This prevents imposing excessive load on the heating components, and damaging the conductive circuit pattern 101*a* of the multi-layer board 101 to which the heating components 103 are mounted or generating crack in the conductive circuit pattern 101*a*. Furthermore, since the thickness between the multi-layer board 101 and the heat sink 104 can be reduced, a lighter and slimmer power module can be realized.

In the power module 107 of this embodiment, heat generated from the electronic components requiring heat dissipation 103 which are mounted to the multi-layer board 101 can be transferred to the heat sink 104 via the high thermal conductive member 105. Strong bonding between the heat sink 104 and the high thermal conductive member 105 can reduce contact thermal resistance of the heat sink 104 and the high thermal conductive member 105. The high thermal conductive member 105 can transfer heat generated from the power semiconductor to the heat sink 104 efficiently, thereby to suppress temperature rise of the components.

In the power module 107 of this embodiment, since air in voids occurring within the high thermal conductive member 105 during production (as mentioned later) comes out of the through hole 102 and sides of the high thermal conductive member 105, the electronic components requiring heat dissipation 103 and the high thermal conductive member 105 stick fast to each other evenly.

Furthermore, by filling the high thermal conductive member 105 in part of the through hole 102 formed in the multi-layer board 101 so as to unify the multi-layer board 101 and the high thermal conductive member 105, the high thermal conductive member 105 and the multi-layer board 101 are adhered to each other. Such a fixing method as to secure the heat sink 104 to the multi-layer board 101 by screws is unnecessary.

Second Embodiment

A power module in accordance with a second embodiment will be described referring to FIG. 2.

Figure 2:
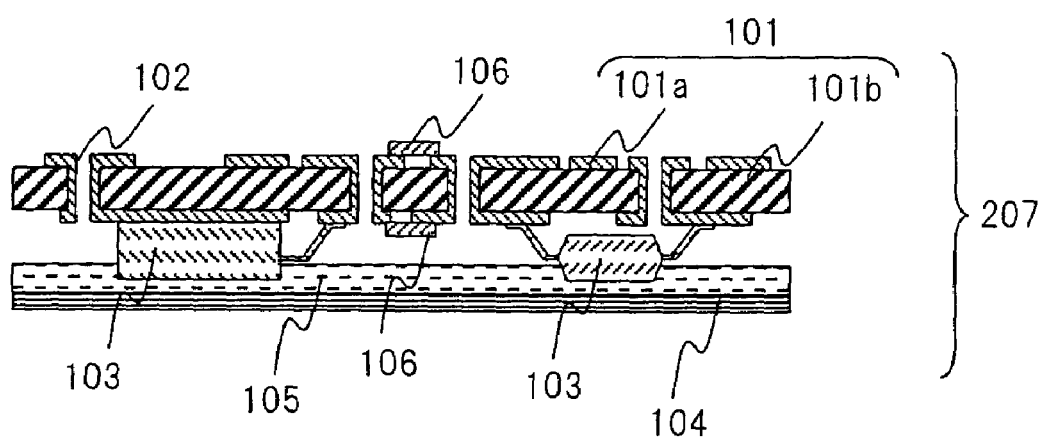
FIG. 2 is a sectional view showing configuration of a power module in accordance with a second embodiment of the present invention.

FIG. 2 is a sectional view showing configuration of the power module in accordance with the second embodiment of the present invention. In FIG. 2, a reference numeral 207 denotes the power module in accordance with the second embodiment. The power module 207 of this embodiment comprises the multi-layer board 101 with the through hole 102, the electronic components requiring heat dissipation 103 (each having an arbitrary different height), the heat sink 104, the high thermal conductive member 105 and the electronic components 106.

The power module of the second embodiment is different from the power module of the first embodiment in that the high thermal conductive member 105 is formed so as to embed only a part of the electronic components 103 therein, thereby to provide space between the high thermal conductive member 105 and the surface of the multi-layer board 101. The high thermal conductive member 105 remains substantially uniform in thickness at the part to which the electronic components requiring heat dissipation 103 are not mounted. Except for this, the power module of the second embodiment is the same as the power module of the first embodiment.

In the case the electronic components 103 and 106 become miniaturized and their mounting becomes densified, small voids occurring within the high thermal conductive member 105 must be removed absolutely. In the power module 207 of this embodiment, since air in voids occurring within the high thermal conductive member 105 during production (as described later) comes out of the through hole 102 and space between the high thermal conductive member 105 and the surface of the multi-layer board 101 absolutely, the electronic components requiring heat dissipation 103 and the high thermal conductive member 105 stick fast to each other certainly and evenly.

With the configuration as shown in FIG. 2, in the power module of the second embodiment, heat can be efficiently transferred from the surfaces of the electronic components requiring heat dissipation 103 to the heat sink 104 via the high thermal conductive member 105. Since the power module of the second embodiment has less amount of the high thermal conductive member 105 than that of the first embodiment, cost reduction and weight saving can be achieved.

In the power module 207 of this embodiment, the high thermal conductive member 105 does not flow from one side of the multi-layer board 101 to other side thereof through the through hole 102 during production (as described later).

The apparatus that builds the power module 207 of this embodiment therein may be configured so that air is fed into the space between the high thermal conductive member 105 and the surface of the multi-layer board 101 along the high thermal conductive member 105 from a fan (not shown), thereby to liberate heat released from the electronic components requiring heat dissipation 103.

Third Embodiment

A power module in accordance with a third embodiment will be described referring to FIG. 3.

Figure 3:
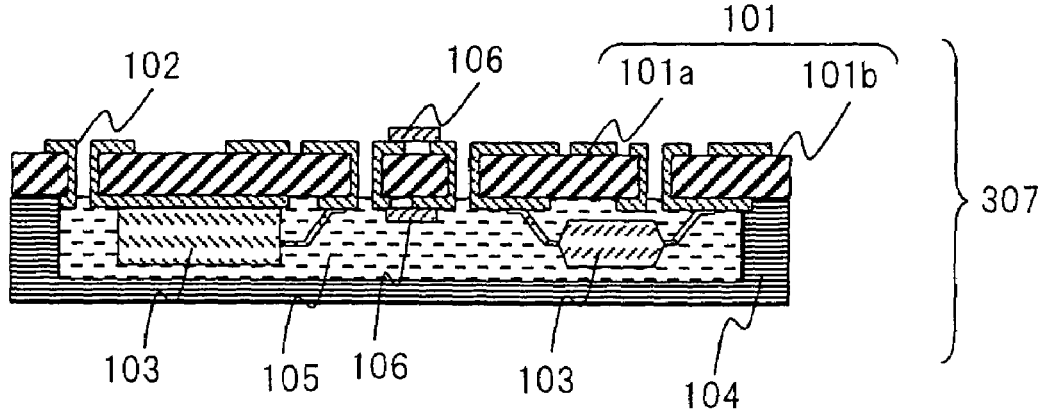
FIG. 3 is a sectional view showing configuration of a power module in accordance with a third embodiment of the present invention.

FIG. 3 is a sectional view showing configuration of the power module in accordance with the third embodiment of the present invention. In FIG. 3, a reference numeral 307 denotes the power module in accordance with this embodiment. The power module 307 of the third embodiment comprises the multi-layer board 101 with the through hole 102, the electronic components requiring heat dissipation 103 (each having an arbitrary different height), the heat sink 104, the high thermal conductive member 105 and the electronic components 106.

The power module of this embodiment is different from that of the first embodiment in that the heat sink 104 is of recessed shape, and the high thermal conductive member 105 that envelops (embeds) the electronic component requiring heat dissipation 103 therein is enclosed with the heat sink 104. With such configuration, heat generated from the electronic components requiring heat dissipation 103 is transferred to the heat sink 104 efficiently. By filling the unhardened member 105 in the depressed portion of the heat sink 104 during production (as described later), the member 105 can be prevented from flowing out.

In the case where the through hole 102 is formed in the multi-layer board 101, by partially filling the unhardened member 105 in the through hole 102 formed in the multi-layer board 101 and unifying them, the high thermal conductive member 105 and the multi-layer board 101 can be adhered to each other and therefore such a fixing method as to secure the heat sink 104 to the multi-layer board 101 by screws becomes unnecessary.

Fourth Embodiment

Figure 4:
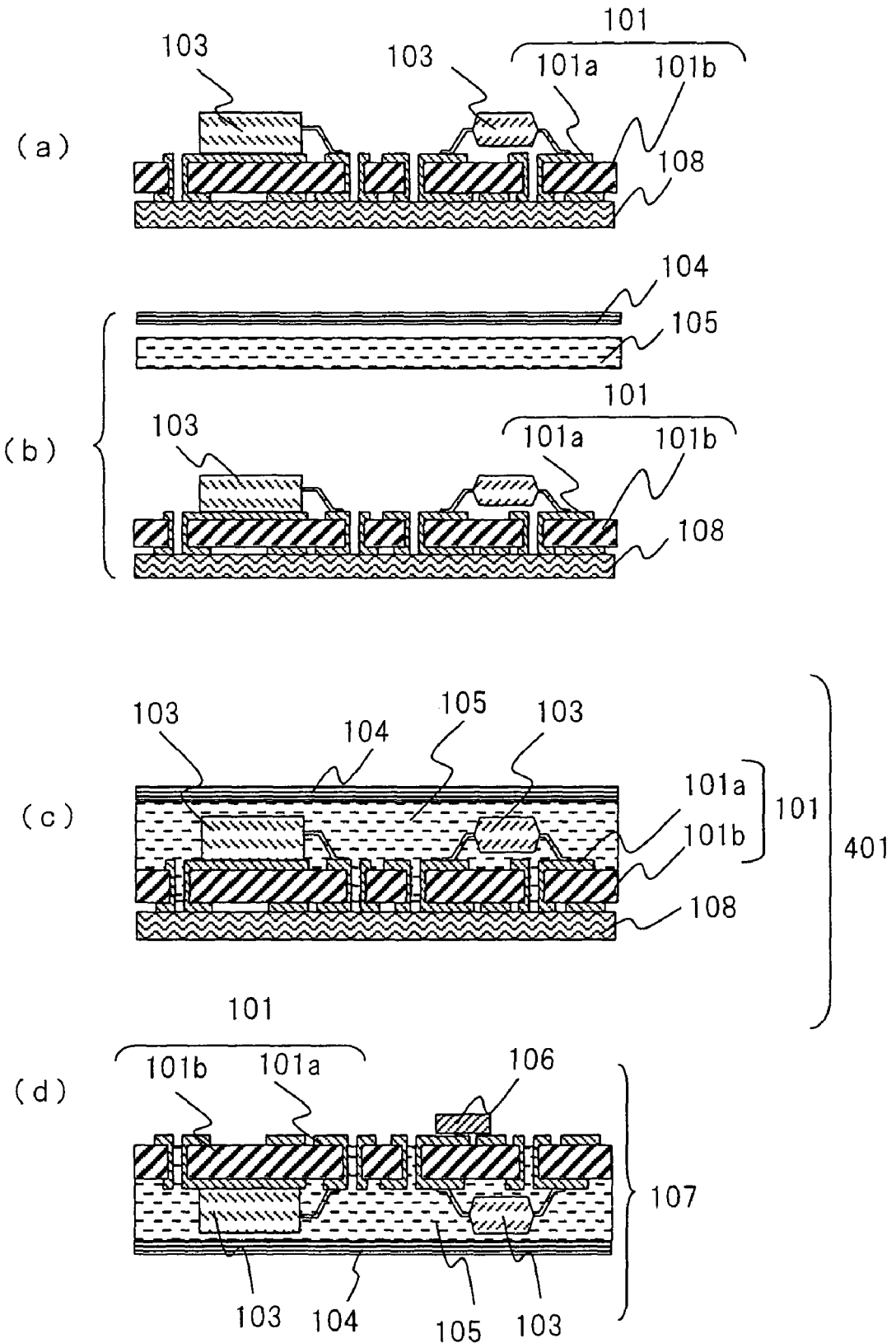
FIG. 4 is a sectional view by step showing a production method of a power module in accordance with a fourth embodiment of the present invention.

A production method of the power module 107 of the first embodiment shown in FIG. 1 will be described referring to FIG. 4. FIG. 4 is a process chart showing a production method of the power module 107 shown in FIG. 1 in accordance with a fourth embodiment.

In a first step shown in FIG. 4(a), electronic components including the electronic components requiring heat dissipation 103 are mounted to one side of the multi-layer board 101. The electronic components requiring heat dissipation 103 are, for example, MOSFET, IGBT, power semiconductor device such as shot key barrier diode, or passive device such as transistor and resistor. An adhesive organic film 108 is adhered to the other side of the multi-layer board 101 (the side to which the electronic components 103 are not mounted). This prevents the unhardened high thermal conductive member 105 from passing through the through hole and flowing out from the other side of the multi-layer board 101 when the high thermal conductive member 105 is disposed in a subsequent step.

Next, in a second step shown in FIG. 4(b), the sheet-like unhardened high thermal conductive member 105 and the heat sink 104 of uniform thickness are disposed on the side of the multi-layer board 101, to which the electronic components requiring heat dissipation 103 are mounted. In this step, the high thermal conductive member 105 is separated from the heat sink 104, and the heat sink 104, the sheet-like unhardened high thermal conductive member 105 and the multi-layer board 101 are vertically arranged in this order. Material for the high thermal conductive member 105 has been described in detail in the first embodiment.

As described in the first embodiment, the heat sink 104 is, for example, an aluminum or copper plate. Preferably, the heat sink 104 is subjected to surface roughening. Surface roughening methods includes the method of spraying aluminum oxide powder and compressed air on the surface of the heat sink. Roughening the surface of the heat sink 104 can increase adhesive strength between the high thermal conductive member 105 and the heat sink 104. The reason for that is because surface area of the heat sink 104 is increased by means of surface roughening and adhesive strength is improved due to the anchor effect. This allows reducing contact thermal resistance of the heat sink 104 and the high thermal conductive member 105 so that heat generated from the power semiconductor can be transferred to the heat sink 104 via the high thermal conductive member 105 efficiently.

Next, in a third step shown in FIG. 4(c), the multi-layer board 101, the high thermal conductive member 105 and the heat sink 104 are laminated to form a laminated body 401. After that, the laminated body 401 is pressurized in the direction of surface (vertical direction in FIG. 4) and heated, thereby that the high thermal conductive member 105 becomes hardened, and the high thermal conductive member 105 and the heat sink 104 are adhered to each other. At this time, the electronic components requiring heat dissipation 103 mounted to the multi-layer board 101 are made to be embedded in the high thermal conductive member 105.

Finally, in a fourth step shown in FIG. 4(d), the organic film 108 is removed and the electronic component 106 is mounted on the side of the multi-layer board 101 to which the organic film 108 is adhered to complete the power module 107.

Since the laminated body 401 is pressurized in the direction of surface and heated in the third step of the fourth embodiment (FIG. 4(c)), air in voids occurring within the unhardened member 105 comes out of the through hole 102 and the sides of the member 105 (direction orthogonal to the pressurizing direction), thereby to bring the electronic components 103 into coherent with the member 105 with reliability.

Fifth Embodiment

Figure 5:
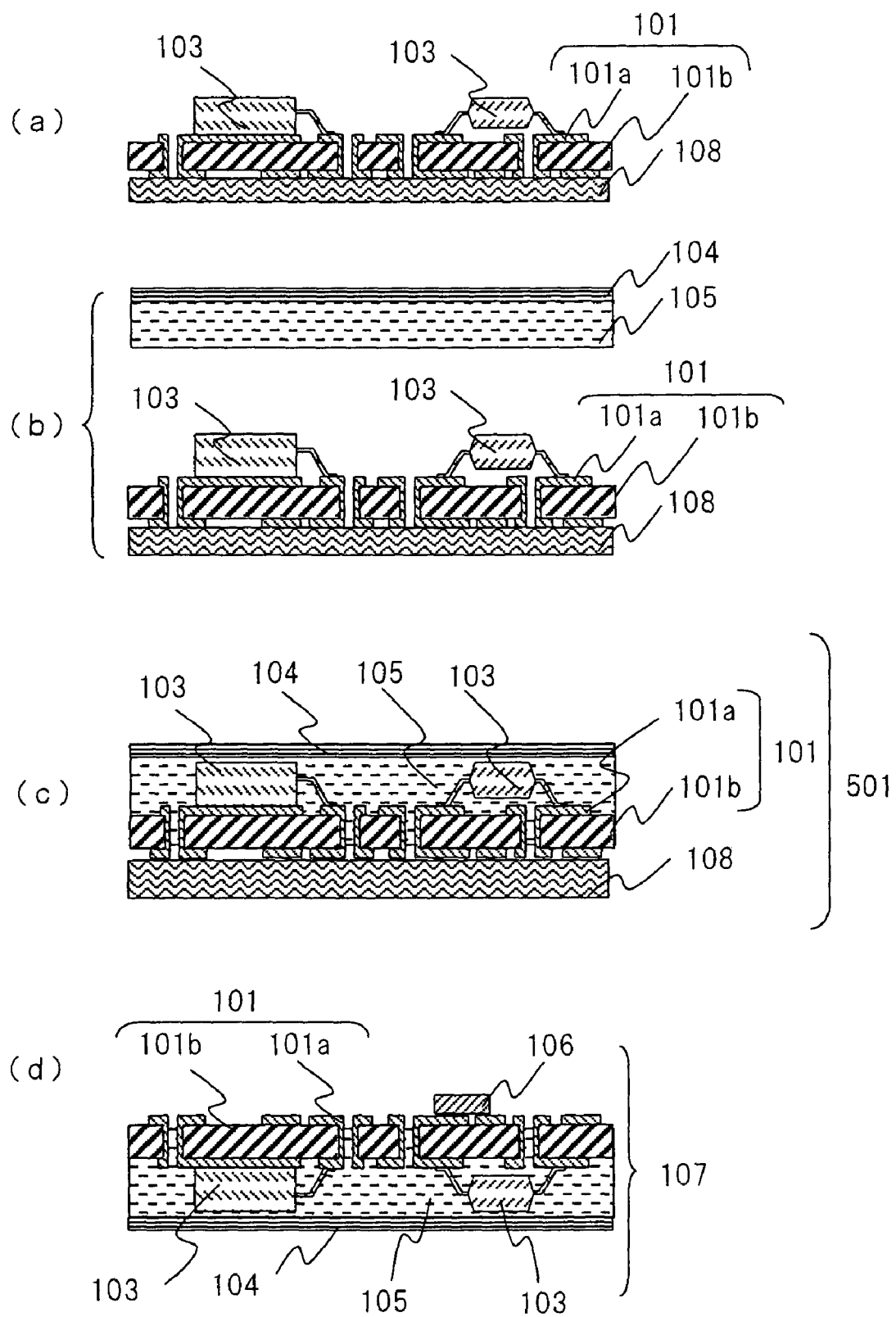
FIG. 5 is a sectional view by step showing a production method of a power module in accordance with a fifth embodiment of the present invention.

A production method of the power module 107 of the first embodiment shown in FIG. 1 will be described referring to FIG. 5. FIG. 5 is a step chart showing a production method of the power module 107 shown in FIG. 1 in accordance with a fourth embodiment.

In a first step shown in FIG. 5(a), electronic components including the electronic components requiring heat dissipation 103 are mounted to one side of the multi-layer board 101. The electronic components requiring heat dissipation 103 are, for example, MOSFET, IGBT, power semiconductor device such as shot key barrier diode, or passive device such as transistor and resistor. The adhesive organic film 108 is adhered to other side of the multi-layer board 101 (the side to which the electronic components 103 are not mounted).

Next, in a second step shown in FIG. 5(b), the paste-like unhardened high thermal conductive member 105 formed of at least inorganic filler and thermosetting resin is printed to the heat sink 104 of uniform thickness so as to have a certain thickness.

The high thermal conductive member 105 is made to be paste-like by mixing the organic filler and the liquid thermosetting resin with a triple roller. When this high thermal conductive member 105 has an appropriate viscosity to be applied over the heat sink 104, it can be used a paste as it is. When the high thermal conductive member 105 has a higher viscosity than desired, it is possible to adjust the viscosity to an appropriate value by mixing a solvent capable of being evaporated a later step. A solvent having a boiling point lower than a cure temperature of the thermosetting resin is used as the solvent. Printing methods of printing the high thermal conductive member 105 includes metal mask printing method, screen-printing method and so on.

Next, in a third step shown in FIG. 5(c), the heat sink 104 on which the high thermal conductive member 105 is formed and the multi-layer board 101 to which the electronic component requiring heat dissipation 103 are mounted are laminated so as to sandwich the high thermal conductive member 105 and the electronic component requiring heat dissipation 103 therebetween. After a laminated body 501 is formed so as to laminate the heat sink 104, the high thermal conductive member 105 and the multi-layer board 101 in this order, the laminated body 501 is pressurized in the direction of surface (vertical direction in FIG. 5) and heated, thereby that the high thermal conductive member 105 becomes hardened, and the electronic components requiring heat dissipation 103, the high thermal conductive member 105 and the heat sink 104 are adhered to each other.

Finally, in a fourth step shown in FIG. 5(d), the organic film 108 is removed and the electronic component 106 is mounted on the side of the multi-layer board 101, to which the organic film 108 is adhered, to complete the power module 107.

Since the laminated body 501 is pressurized in the direction of surface and heated in the third step of the fifth embodiment (FIG. 5(c)), air in voids occurring within the unhardened member 105 comes out of the through hole 102 and the sides of the member 105 (the direction orthogonal to the pressurizing direction), thereby to bring the electronic components 103 into coherent with the member 105 with reliability.

Sixth Embodiment

Figure 6:
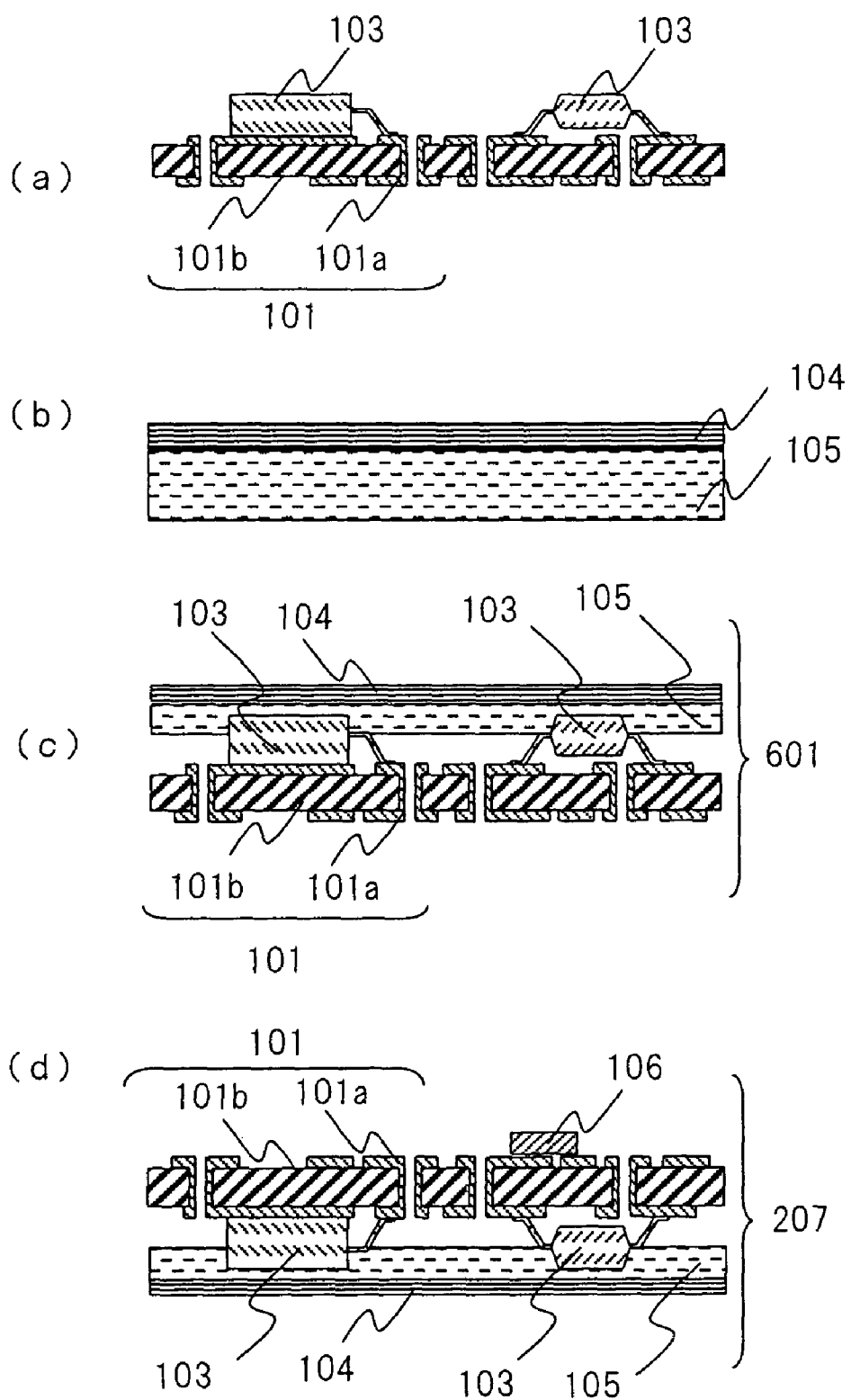
FIG. 6 is a sectional view by step showing a production method of a power module in accordance with a sixth embodiment of the present invention.

A production method of the power module 207 of the second embodiment shown in FIG. 2 will be described referring to FIG. 6. FIG. 6 is a process chart showing a production method of the power module 207 shown in FIG. 2 in accordance with a sixth embodiment.

In a first step shown in FIG. 6(a), electronic components including the electronic components requiring heat dissipation 103 are mounted to one side of the multi-layer board 101. The electronic components requiring heat dissipation 103 are, for example, MOSFET, IGBT, power semiconductor device such as shot key barrier diode, or passive device such as transistor and resistor. The adhesive organic film 108 needs not be adhered in the sixth embodiment.

Next, in a second step shown in FIG. 6(b), the paste-like unhardened high thermal conductive member 105 formed of at least inorganic filler and thermosetting resin is printed to the heat sink 104 of uniform thickness so as to have a certain thickness. The production method of the unhardened high thermal conductive member 105 has been described in detail in the fifth embodiment.

Next, in a third step shown in FIG. 6(c), the heat sink 104 on which the high thermal conductive member 105 is formed and the multi-layer board 101 to which the electronic components requiring heat dissipation 103 are mounted are laminated so as to sandwich the high thermal conductive member 105 and the electronic components requiring heat dissipation 103 therebetween. After a laminated body 601 is formed so as to laminate the heat sink 104, the high thermal conductive member 105 and the multi-layer board 101 in this order, the laminated body 601 is pressurized in the direction of surface (vertical direction in FIG. 6) and heated, thereby that the high thermal conductive member 105 becomes hardened, and the electronic components requiring heat dissipation 103, the high thermal conductive member 105 and the heat sink 104 are adhered to each other.

The laminated body 601 of this embodiment is formed so that the high thermal conductive member 105 coats the surfaces of the electronic components mounted to the multi-layer board 101 (or embeds part of the electronic components therein), thereby generating space between the high thermal conductive member 105 and the multi-layer board 101. The production method of the present embodiment is different from that of the fifth embodiment wherein the whole of the electronic components is embedded in the high thermal conductive member 105 in this respect.

Finally, in a fourth step shown in FIG. 6(d), the electronic component 106 is mounted on the side of the multi-layer board 101, to which the electronic components 103 are not mounted, to complete the power module 207.

Since air in voids occurring within the unhardened member 105 comes out of the through hole 102 and the space between the high thermal conductive member 105 and the multi-layer board 101 when the laminated body 501 is pressurized in the direction of surface and heated in the third step of the sixth embodiment (FIG. 6(c)), the electronic components 103 can be brought into coherent with the member 105 with reliability.

In the sixth embodiment, the paste-like unhardened high thermal conductive member 105 is printed to the heat sink 104 of uniform thickness so as to have a certain thickness in the second step shown in FIG. 6(b). Needless to say, it is also possible that the sheet-like unhardened high thermal conductive member 105 and the sheet-like heat sink 104 are disposed on the side of the multi-layer board 101, to which the electronic components requiring heat dissipation are mounted (FIG. 4(b)), and the laminated body (with a predetermined space between the high thermal conductive member 105 and the multi-layer board 101 provided) is pressurized and heated (FIG. 4(c)).

Seventh Embodiment

Figure 7:
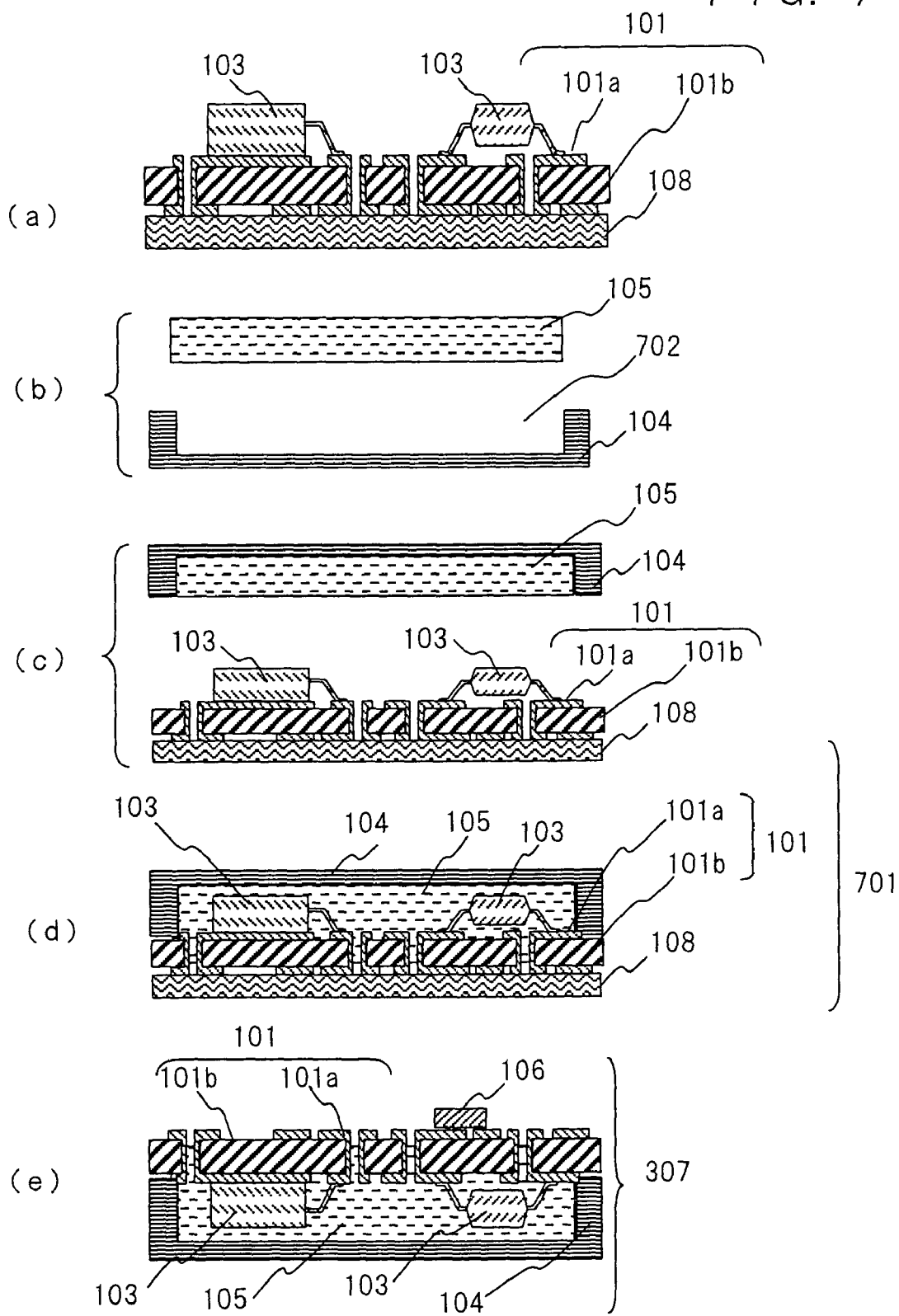
FIG. 7 is a sectional view by step showing a production method of a power module in accordance with a seventh embodiment of the present invention.

A production method of the power module 307 of the third embodiment shown in FIG. 3 will be described referring to FIG. 7. FIG. 7 is a process chart showing the production method of the power module 307 shown in FIG. 3 in accordance with a seventh embodiment.

In a first step shown in FIG. 7(a), electronic components including the electronic components requiring heat dissipation 103 are mounted to one side of the multi-layer board 101. The electronic components requiring heat dissipation 103 are, for example, MOSFET, IGBT, power semiconductor device such as shot key barrier diode, or passive device such as transistor and resistor. The adhesive organic film 108 is adhered to other side of the multi-layer board 101 (the side to which the electronic components 103 are not mounted).

Next, in a second step shown in FIG. 7(b), the heat sink 104 is formed so as to be recessed shape. The paste-like unhardened high thermal conductive member 105 formed of at least inorganic filler and thermosetting resin is produced. The production method of the unhardened high thermal conductive member 105 has been described in detail in the fifth embodiment. The paste-like unhardened high thermal conductive member 105 is filled in a depressed portion 702 of the heat sink 104.

Alternatively, it is also possible that the sheet-like unhardened high thermal conductive member 105 is cut to be recessed shape and the member thus cut is filled in the depressed portion 702 (a similar method as in FIG. 4 (the fourth embodiment)).

Next, in a third step shown in FIG. 7(c), the heat sink 104, the high thermal conductive member 105 and the multi-layer board 101 are laminated in this order so as to set the side of the multi-layer board 101 to which the electronic components requiring heat dissipation 103 are mounted as opposed to the high thermal conductive member 105 filled in the depressed portion 702 of the heat sink 104.

Next, in a fourth step shown in FIG. 7(d), the high thermal conductive member 105 is hardened by use of a heating oven, thereby that the whole of the electronic components requiring heat dissipation 103 is coated with the high thermal conductive member 105 (embedded in the high thermal conductive member 105) to form a laminated body 701.

Finally, in a fifth step shown in FIG. 7(e), the organic film 108 is removed and the electronic component 106 is mounted on the side of the multi-layer board 101, to which the organic film 108 is adhered, to complete the power module 307.

As a substitute for the fourth step shown in FIG. 7(d), it is also possible, of course, that part of the electronic components requiring heat dissipation 103 is coated with the high thermal conductive member 105 (embedded in the high thermal conductive member 105) to form the laminated body 701 with space between the high thermal conductive member 105 and the multi-layer board 101 provided. A power module 807 of an eighth embodiment (as described later) can be produced by use of this production method.

Eighth Embodiment

A power module in accordance with an eighth embodiment will be described referring to FIG. 8.

Figure 8:
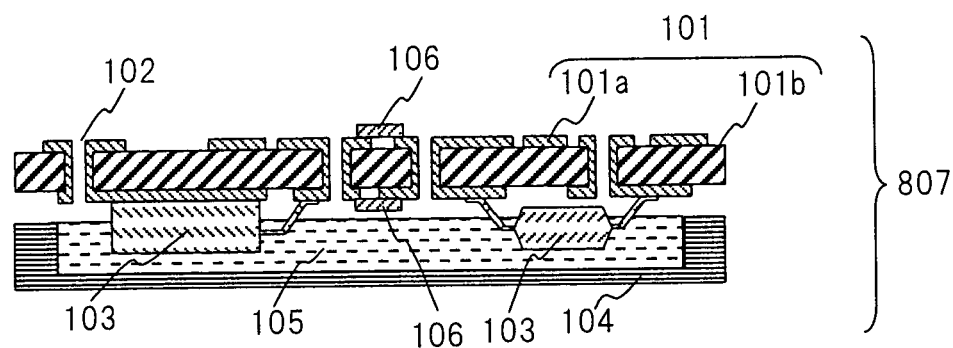
FIG. 8 is a sectional view showing configuration of a power module in accordance with an eighth embodiment of the present invention.

FIG. 8 is a sectional view showing configuration of the power module in accordance with the eighth embodiment of the present invention. The power module 807 of this embodiment comprises the multi-layer board 101 with the through hole 102, the electronic components requiring heat dissipation 103 (each having an arbitrary different height), the heat sink 104, the high thermal conductive member 105 and the electronic components 106.

The power module of the eighth embodiment is different from that of the third embodiment in that the high thermal conductive member 105 is formed so as to embed only a part of the surfaces of the electronic components 103 therein, thereby to provide space between the high thermal conductive member 105 and the multi-layer board 101. The high thermal conductive member 105 remains uniform in thickness at the part to which the electronic components requiring heat dissipation 103 are not mounted. Except for this, the power module of the eighth embodiment is the same as that of the third embodiment.

In the case where the electronic components 103 and 106 become miniaturized, small voids occurring within the high thermal conductive member 105 must be removed absolutely. In the power module 807 of this embodiment, since air in voids occurring within the high thermal conductive member 105 during production (as described later) comes out of the through hole 102 and space between the high thermal conductive member 105 and the surface of the multi-layer board 101 with reliability, the electronic components requiring heat dissipation 103 and the high thermal conductive member 105 stick fast to each other evenly.

In the power module 807 of this embodiment, the heat sink 104 is formed to recessed shape and the high thermal conductive member 105 that envelops (embeds) the electronic components requiring heat dissipation 103 therein is enclosed with the heat sink 104. The high thermal conductive member 105 remains substantially uniform in thickness at the part to which the electronic components requiring heat dissipation 103 are not mounted. With such configuration, heat generated from the electronic components requiring heat dissipation 103 can be transferred to the heat sink 104 efficiently. By filling the unhardened member 105 in the depressed portion of the heat sink 104 during production (as described later), the member 105 is prevented from flowing out. Since the power module of this embodiment has less amount of the high thermal conductive member 105 than the power module of the third embodiment, cost reduction and weight saving can be achieved.

In the power module 807 of this embodiment, the high thermal conductive member 105 does not flow from one side of the multi-layer board 101 to other side thereof through the through hole 102 during production (as described later).

The apparatus that builds the power module 807 therein may be configured so that air is fed into the space between the high thermal conductive member 105 and the surface of the multi-layer board 101 along the high thermal conductive member 105 from a fan (not shown), thereby to liberate heat released from the electronic components requiring heat dissipation 103.

Ninth Embodiment

A power module in accordance with a ninth embodiment will be described referring to FIG. 9.

Figure 9:
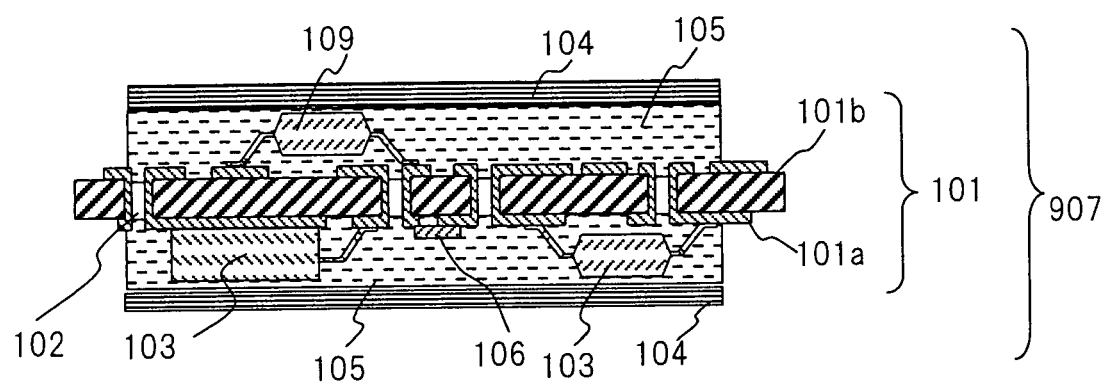
FIG. 9 is a sectional view showing configuration of a power module in accordance with a ninth embodiment of the present invention.

FIG. 9 is a sectional view showing configuration of the power module in accordance with the ninth embodiment of the present invention. In FIG. 9, a reference numeral 907 denotes the power module of the ninth embodiment. The power module 907 of this embodiment comprises the multi-layer board 101 with the through hole 102, the electronic components requiring heat dissipation 103 and 109 (each having an arbitrary different height), the heat sink 104, the high thermal conductive member 105 and the electronic components 106.

Similar to the electronic component 103, an electronic component requiring heat dissipation 109 is a, for example, MOSFET, IGBT, power semiconductor device such as shot key barrier diode, or passive device such as transistor and resistor.

The power module 907 of the ninth embodiment is different from that of the first embodiment in that, the electronic components requiring heat dissipation 103 and 109 are mounted and the high thermal conductive member 105 and the heat sink 104 are formed on the both sides of the multi-layer board 101. Except for this, the power module 907 of the ninth embodiment is the same as that of the first embodiment.

The power module of this embodiment consists of five layers of the heat sink 104, the high thermal conductive member 105, the multi-layer board 101, the high thermal conductive member 105 and the heat sink 104, which are vertically arranged in this order. The electronic components 103, 106 and 109 are mounted to the insulating board 101b of the multi-layer board 101. The electronic components requiring heat dissipation 103 and 109, respectively, are disposed on both sides of the multi-layer board 101. The high thermal conductive member 105 envelops (embeds) the electronic components requiring heat dissipation 103 and 109 therein. The heat sink 104 releases heat generated from the electronic components requiring heat dissipation 103 and 109 to the outside.

After heat occurring from the electronic components requiring heat dissipation 103 and 109 is diffused into the high thermal conductive member 105, it is transferred to the heat sink 104 and released from the heat sink 104 into the air.

In the power module of this embodiment, heat generated from the electronic components requiring heat dissipation 103 and 109 mounted to both sides of the multi-layer board 101 can be efficiently transferred to the heat sink 104 via the high thermal conductive member 105. By adhering the high thermal conductive member 105 to the heat sink strongly, it is possible to reduce contact thermal resistance of the heat sink 104 and the high thermal conductive member 105. The high thermal conductive member 105 is capable of transferring heat from the power semiconductor to the heat sink 104 efficiently. This enables suppressing temperature rise of components at low level.

Tenth Embodiment

A power module in accordance with a tenth embodiment will be described referring to FIG. 10.

Figure 10:
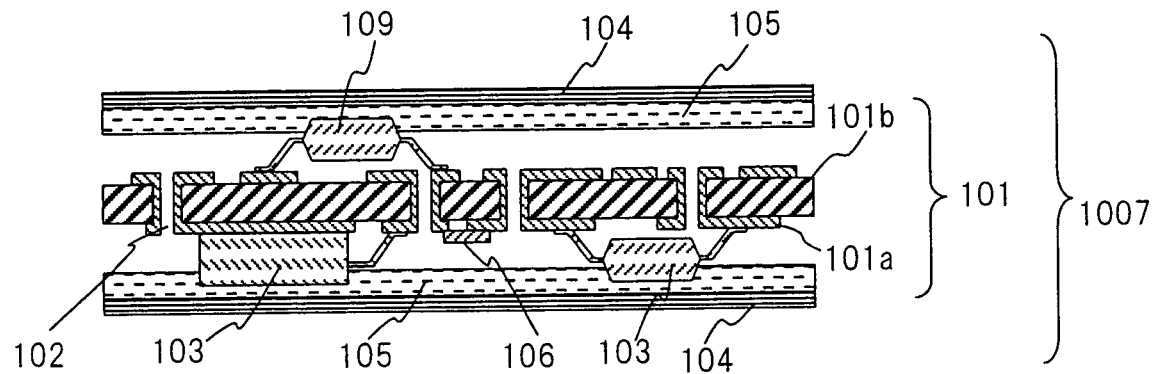
FIG. 10 is a sectional view showing configuration of a power module in accordance with a tenth embodiment of the present invention.

FIG. 10 is a sectional view showing configuration of the power module in accordance with the tenth embodiment of the present invention. In FIG. 10, a reference numeral 1007 denotes the power module of the tenth embodiment. The power module 1007 of this embodiment comprises the multi-layer board 101 with the through hole 102, the electronic components requiring heat dissipation 103 and 109 (each having an arbitrary different height), the heat sink 104, the high thermal conductive member 105 and the electronic components 106.

The power module of the tenth embodiment is different from that of the ninth embodiment in that the high thermal conductive member 105 is formed so as to embed only a part of the surfaces of the electronic components 103 and 109 therein, thereby to provide space between the high thermal conductive member 105 and the multi-layer board 101. The high thermal conductive member 105 remains substantially uniform in thickness at the part to which the electronic components requiring heat dissipation 103 and 109 are not mounted. Except for this, the power module of the tenth embodiment is the same as that of the ninth embodiment.

In the case where the through hole 102, and the electronic components 103 and 109 become miniaturized, small voids occurring within the high thermal conductive member 105 must be removed absolutely. In the power module 1007 of this embodiment, since air in voids occurring within the high thermal conductive member 105 during production (as described later) comes out of the through hole 102 and space between the high thermal conductive member 105 and the surface of the multi-layer board 101 with reliability, the electronic components requiring heat dissipation 103 and 109, and the high thermal conductive member 105 stick fast to each other evenly.

With the configuration shown in FIG. 10, the power module of the tenth embodiment can transfer heat from the surfaces of the electronic components requiring heat dissipation 103 and 109 to the heat sink 104 via the high thermal conductive member 105 efficiently. Furthermore, since the power module of this embodiment has less amount of the high thermal conductive member 105 than that of the ninth embodiment, cost reduction and weight saving can be realized.

In the power module 1007 of this embodiment, the high thermal conductive member 105 does not flow from one side of the multi-layer board 101 to other side thereof through the through hole 102 during production (as described later).

The apparatus that builds the power module 1007 therein may be configured so that air is fed into the space between the high thermal conductive member 105 and the surface of the multi-layer board 101 along the high thermal conductive member 105 from a fan (not shown), thereby to liberate heat released from the electronic components requiring heat dissipation 103 and 109.

Eleventh Embodiment

A power module in accordance with an eleventh embodiment will be described referring to FIG. 11.

Figure 11:
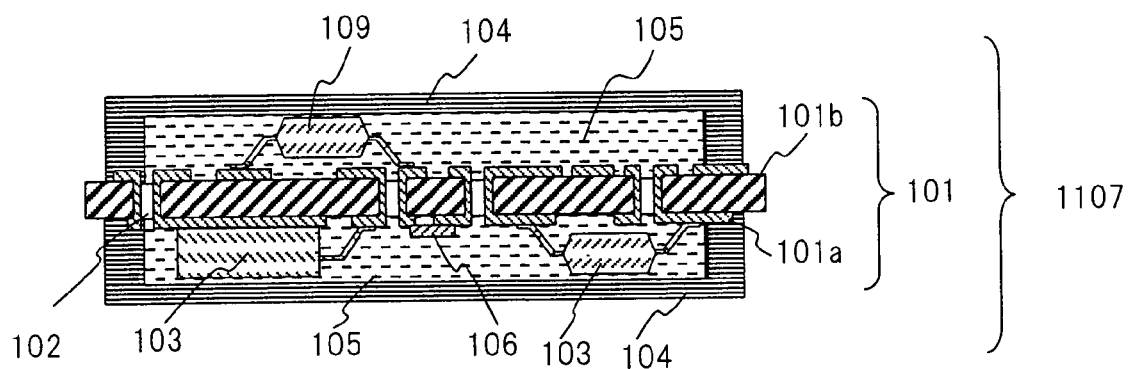
FIG. 11 is a sectional view showing configuration of a power module in accordance with an eleventh embodiment of the present invention.

FIG. 11 is a sectional view showing configuration of the power module in accordance with the eleventh embodiment of the present invention. In FIG. 11, a reference numeral 1107 denotes the power module of this embodiment. The power module 1107 of the eleventh embodiment comprises the multi-layer board 101 with the through hole 102, the electronic components requiring heat dissipation 103 and 109 (each having an arbitrary different height), the heat sink 104, the high thermal conductive member 105 and the electronic components 106.

The power module of this embodiment is different from that of tenth embodiment in that the heat sink 104 is formed to recessed shape and the high thermal conductive member 105 that envelops (embeds) the electronic components requiring heat dissipation 103 and 109 therein is enclosed with the heat sink 104. With such configuration, heat generated from the electronic components requiring heat dissipation 103 can be transferred to the heat sink 104 efficiently. By filling the unhardened member 105 in the depressed portion of the heat sink 104 during production (as described later), the member 105 can be prevented from flowing out.

Twelfth Embodiment

A power module in accordance with a twelfth embodiment will be described referring to FIG. 12.

Figure 12:
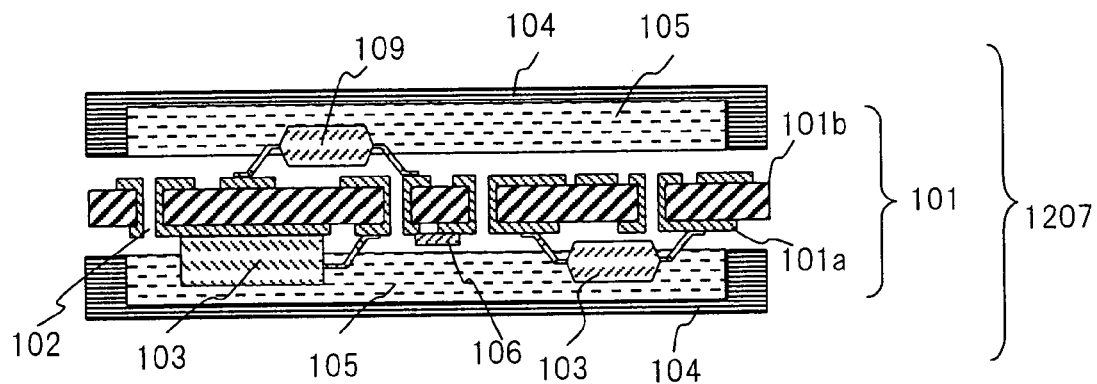
FIG. 12 is a sectional view showing configuration of a power module in accordance with a twelfth embodiment of the present invention.

FIG. 12 is a sectional view showing configuration of the power module in accordance with the twelfth embodiment of the present invention. In FIG. 12, a reference numeral 1207 denotes the power module of this embodiment. The power module 1207 of the twelfth embodiment comprises the multi-layer board 101 with the through hole 102, the electronic components requiring heat dissipation 103 and 109 (each having an arbitrary different height), the heat sink 104, the high thermal conductive member 105 and the electronic components 106.

The power module of the twelfth embodiment is different from that of the eleventh embodiment in that the high thermal conductive member 105 is formed so as to embed only a part of the surfaces of the electronic components 103 and 109 therein, thereby to provide space between the high thermal conductive member 105 and the multi-layer board 101. The high thermal conductive member 105 remains substantially uniform in thickness at the part to which the electronic components requiring heat dissipation 103 and 109 are not mounted. Except for this, the power module of the twelfth embodiment is the same as that of the eleventh embodiment.

In the case where the electronic components 103 and 109 become miniaturized, small voids occurring within the high thermal conductive member 105 must be removed absolutely. In the power module 1207 of this embodiment, since air in voids occurring within the high thermal conductive member 105 during production (as described later) comes out of the through hole 102 and space between the high thermal conductive member 105 and the surface of the multi-layer board 101 with reliability, the high thermal conductive member 105 and the electronic components requiring heat dissipation 103 and 109, respectively, stick fast to each other evenly.

In the power module 1207 of this embodiment, the heat sink 104 is formed to recessed shape and the high thermal conductive member 105 that envelops (embeds) the electronic components requiring heat dissipation 103 and 109 therein is enclosed with the heat sink 104. With such configuration, heat generated from the electronic components requiring heat dissipation 103 and 109 can be transferred to the heat sink 104 efficiently. By filling the unhardened member 105 in the depressed portion of the heat sink 104 during production (as described later), the member 105 can be prevented from flowing out. Since the power module of this embodiment has less amount of the high thermal conductive member 105 than that of the third embodiment, cost reduction and weight saving can be achieved.

The apparatus that builds the power module 1207 therein may be configured so that air is fed into the space between the high thermal conductive member 105 and the surface of the multi-layer board 101 along the high thermal conductive member 105 from a fan (not shown), thereby to liberate heat released from the electronic components requiring heat dissipation 103.

Thirteenth Embodiment

Figure 13:
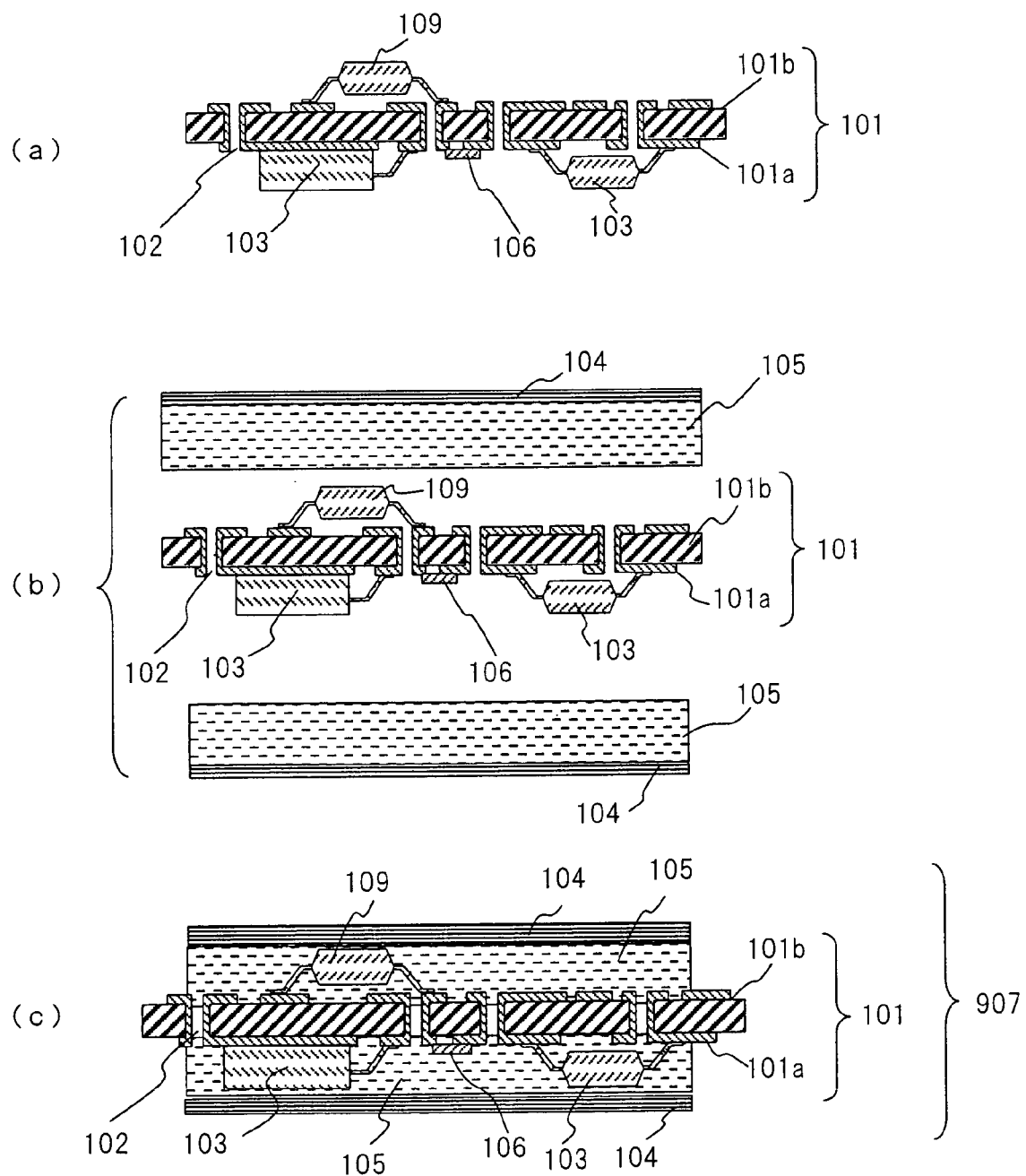
FIG. 13 is a sectional view by step showing a production method of a power module in accordance with a thirteenth embodiment of the present invention.

A production method of the power module 907 shown in FIG. 9 will be described referring to FIG. 13. FIG. 13 is a process chart showing a production method of the power module 907 shown in FIG. 9 in accordance with a thirteenth embodiment.

In a first step shown in FIG. 13(a), the electronic components requiring heat dissipation 103 and the electronic component 106 are mounted to one side of the multi-layer board 101, and the electronic component requiring heat dissipation 109 is mounted to other side thereof.

Next, in a second step shown in FIG. 13(b), the paste-like unhardened high thermal conductive member 105 formed of at least inorganic filler and thermosetting resin is printed to the heat sink 104 of uniform thickness so as to have a certain thickness. The production method of the unhardened high thermal conductive member 105 has been described in detail in the fifth embodiment.

Next, in a third step shown in FIG. 13(c), a laminated body wherein the multi-layer board 101 and the heat sink 104 are laminated so that the high thermal conductive member 105 printed to the heat sink 104 faces to each side of the multi-layer board 101 is formed at both sides simultaneously or one by one. At this time, the electronic components requiring heat dissipation 103 and 109 are made to be embedded in the high thermal conductive member 105. The laminated body is pressurized in the direction of surface (vertical direction in FIG. 13) and heated, thereby that the high thermal conductive member 105 becomes hardened, and the high thermal conductive member 105, and the electronic components requiring heat dissipation 103 and 109, respectively, are adhered to each other to complete the power module 907. Impletion of the third step under reduced pressure can further prevent voids from occurring.

Fourteenth Embodiment

Figure 14:
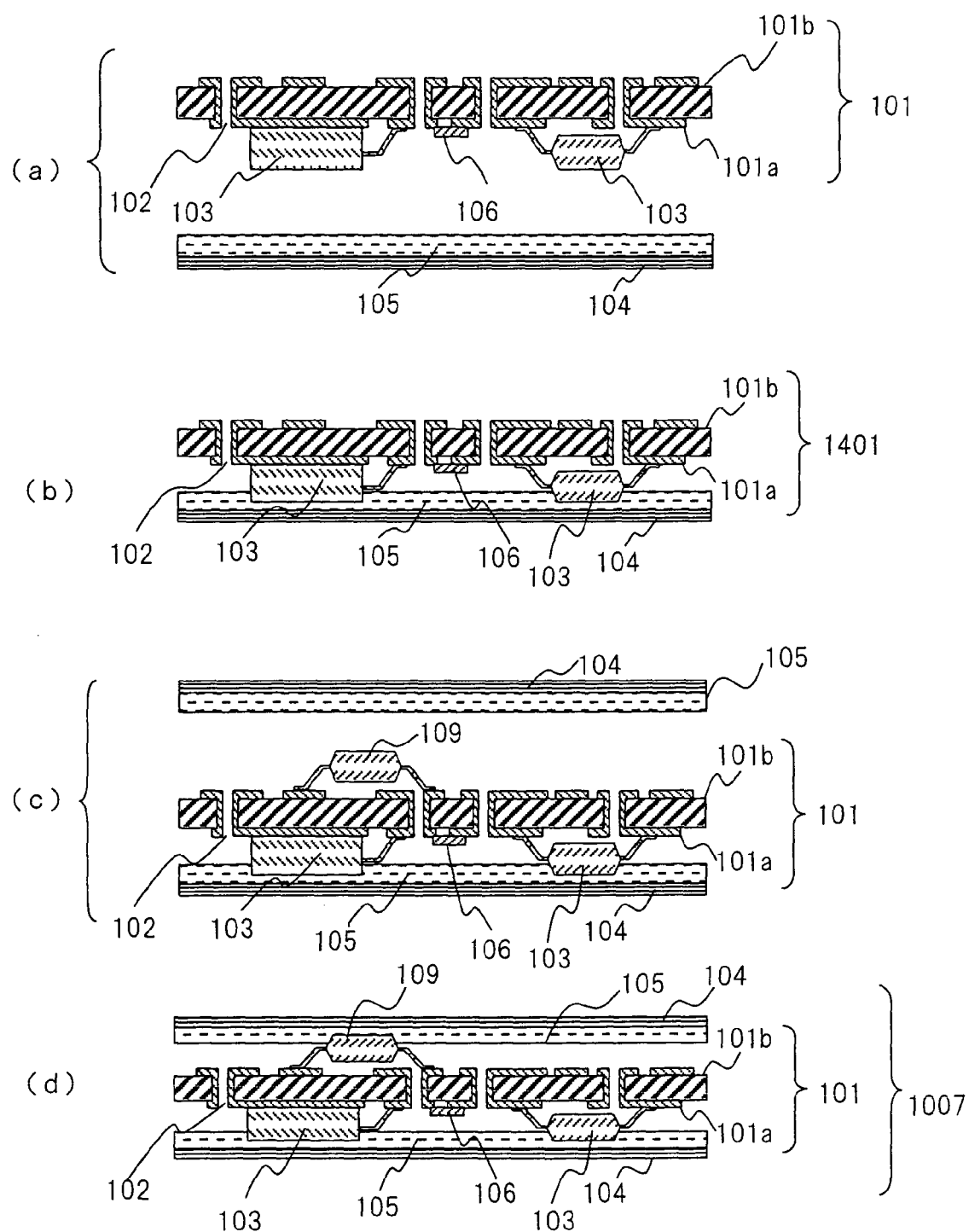
FIG. 14 is a sectional view by step showing a production method of a power module in accordance with a fourteenth embodiment of the present invention.

A production method of the power module 1007 shown in FIG. 10 will be described referring to FIG. 14. FIG. 14 is a step chart showing a production method of the power module 1007 shown in FIG. 10 in accordance with a fourteenth embodiment.

In a first step shown in FIG. 14(a), the electronic components requiring heat dissipation 103 and the electronic component 106 are mounted to one side of the multi-layer board 101. The paste-like unhardened high thermal conductive member 105 formed of at least inorganic filler and thermosetting resin is printed to the heat sink 104 of uniform thickness so as to have a certain thickness. The production method of the unhardened high thermal conductive member 105 has been described in detail in the fifth embodiment.

Next, in a second step shown in FIG. 14(b), the heat sink 104 on which the high thermal conductive member 105 is formed and the multi-layer board 101 to which the electronic component requiring heat dissipation 103 are mounted are laminated so as to sandwich the high thermal conductive member 105 and the electronic component requiring heat dissipation 103 therebetween. After a laminated body 1401 is formed so as to laminate the heat sink 104, the high thermal conductive member 105 and the multi-layer board 101 in this order, the laminated body 1401 is pressurized in the direction of surface (vertical direction in FIG. 14) and heated, thereby that the high thermal conductive member 105 becomes hardened, and the electronic components requiring heat dissipation 103, the high thermal conductive member 105 and the heat sink 104 are adhered to each other. The laminated body 1401 is formed so that the high thermal conductive member 105 coats the surfaces of the electronic components mounted to the multi-layer board 101 (or embeds part of the electronic components therein), thereby to provide space the high thermal conductive member 105 and the multi-layer board 101. The high thermal conductive member 105 remains substantially uniform in thickness at the part to which the electronic components requiring heat dissipation 103 are not mounted.

Next, in a third step shown in FIG. 14(c), the electronic component requiring heat dissipation 109 is mounted to the side of the multi-layer board 101, to which the electronic components 103 and 106 are not mounted in the first step. The paste-like unhardened high thermal conductive member 105 formed of at least inorganic filler and thermosetting resin is printed to the heat sink 104 of uniform thickness so as to have a certain thickness.

Finally, in a fourth step shown in FIG. 14(d), the heat sink 104 on which the high thermal conductive member 105 is formed and the multi-layer board 101 to which the electronic component requiring heat dissipation 109 is mounted are laminated so as to sandwich the high thermal conductive member 105 and the electronic component requiring heat dissipation 109 therebetween. After that, the laminated body is pressurized in the direction of surface (vertical direction in FIG. 14) and heated, thereby that the high thermal conductive member 105 becomes hardened, and the electronic components requiring heat dissipation 109, the high thermal conductive member 105 and the heat sink 104 are adhered to each other to complete the power module 1007.

The power module 1007 is formed so that the high thermal conductive member 105 coats the surfaces of the electronic components mounted to the multi-layer board 101 (or embeds part of the electronic components therein), thereby to provide space the high thermal conductive member 105 and the multi-layer board 101.

Since air in voids occurring within the unhardened high thermal conductive member 105 comes out of the through hole 102 and space between the high thermal conductive member 105 and the multi-layer board 101 when the laminated body is pressurized in the direction of surface and heated in the second step (FIG. 14(b)) and the fourth step (FIG. 14(d)), and the electronic components requiring heat dissipation 103 and 109, respectively, can be stuck fast to the high thermal conductive member 105 with reliability.

Fifteenth Embodiment

Figure 15:
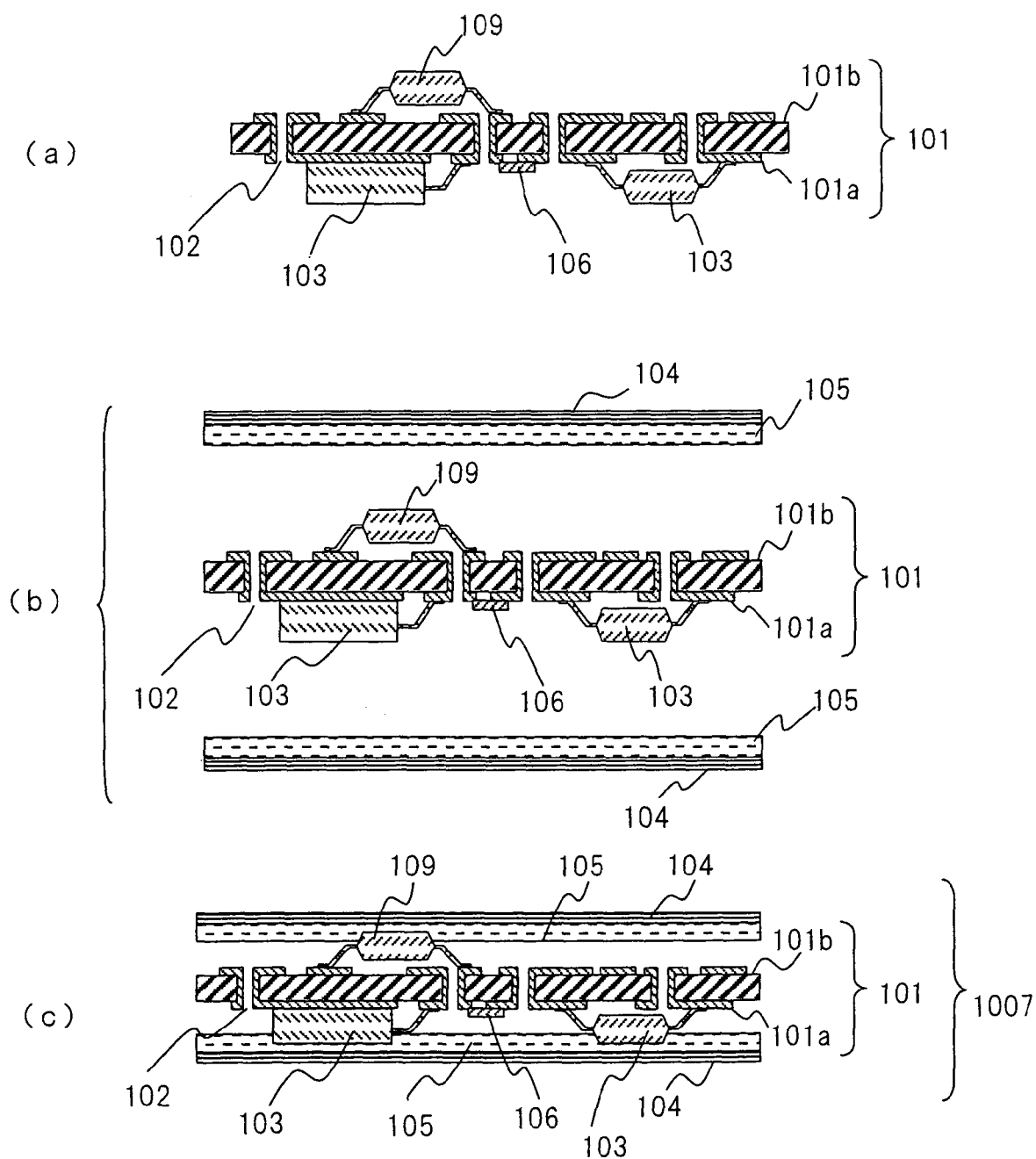
FIG. 15 is a sectional view by step showing a production method of a power module in accordance with a fifteenth embodiment of the present invention.

Another production method of the power module 1007 shown in FIG. 10 will be described referring to FIG. 15. FIG. 15 is a process chart showing a production method of the power module 1007 shown in FIG. 10 in accordance with a fifteenth embodiment.

Since a first step (FIG. 15(a)) and a second step (FIG. 15(b)) of the fifteenth embodiment are the same as the first step (FIG. 13(a)) and the second step (FIG. 13(b)) of the thirteenth embodiment, explanations thereof are omitted.

Next, in a third step shown in FIG. 15(c), a laminated body wherein the multi-layer board 101 and the heat sink 104 are laminated so that the high thermal conductive member 105 formed on the heat sink 104 faces to each side of the multi-layer board 101 is formed on each side of the multi-layer board 101 simultaneously. The laminated body is formed so that the high thermal conductive member 105 coats the surfaces of the electronic components (or embeds part of the electronic components therein), thereby to provide space between the high thermal conductive member 105 and the multi-layer board 101. The high thermal conductive member 105 remains substantially uniform in thickness at the part to which the electronic components requiring heat dissipation 103 and 109 are not mounted. Next, the laminated body is pressurized in the direction of surface (vertical direction in FIG. 15) and heated, thereby that the high thermal conductive member 105 becomes hardened, and the high thermal conductive member 105, and the electronic components requiring heat dissipation 103 and 109, respectively, are adhered to each other to complete the power module 1007.

In the production method of the fifteenth embodiment, the heat sink 104 and the high thermal conductive member 105 are adhered to both sides of the multi-layer board 101 simultaneously. As the production method of the fifteenth embodiment has less number of steps than the production method of the thirteenth embodiment, the power module 1007 of the tenth embodiment can be produced at a lower cost.

Sixteenth Embodiment

Figure 16:
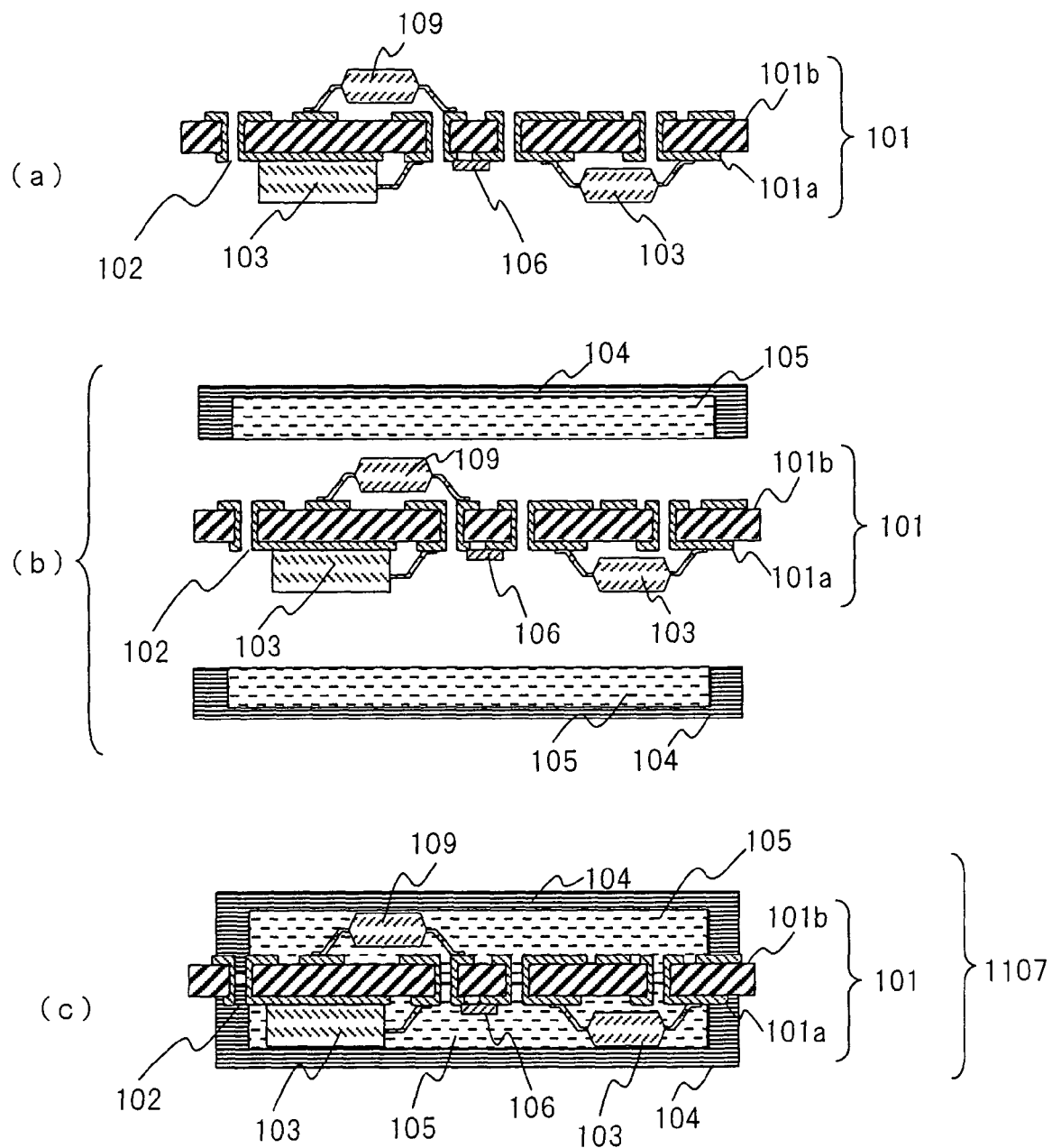
FIG. 16 is a sectional view by step showing a production method of a power module in accordance with a sixteenth embodiment of the present invention.

A production method of the power module 1107 shown in FIG. 11 will be described referring to FIG. 16. FIG. 16 is a process chart showing a production method of the power module 1107 shown in FIG. 11 in accordance with a sixteenth embodiment.

In a first step shown in FIG. 16(a), the electronic components requiring heat dissipation 103 and the electronic component 106 are mounted to one side of the multi-layer board 101, and the electronic component requiring heat dissipation 109 is mounted to other side thereof.

Next, in a second step shown in FIG. 16(b), the heat sink 104 is formed so as to be recessed shape. The paste-like unhardened high thermal conductive member 105 formed of at least inorganic filler and thermosetting resin is produced. The production method of the unhardened high thermal conductive member 105 has been described in detail in the fifth embodiment. The paste-like unhardened high thermal conductive member 105 is filled in a depressed portion of the heat sink 104.

Alternatively, it is also possible that the sheet-like unhardened high thermal conductive member 105 is cut to be recessed shape and the member thus cut is filled in the depressed portion 702 (a similar method as in FIG. 4 (the fourth embodiment)).

Next, the multi-layer board 101 and a heat sink 104 are laminated so as to set each side of the multi-layer board 101 as opposed to the high thermal conductive member 105 filled in the depressed portion of the heat sink 104.

Finally, in a third step shown in FIG. 16(c), the high thermal conductive member 105 is hardened by use of a heating oven at both sides simultaneously (or one by one), thereby that the whole of the electronic components requiring heat dissipation 103 mounted to the multi-layer board 101 is coated with the high thermal conductive member 105 (embedded in the high thermal conductive member 105) to form a laminated body 1107.

All steps in the production method of the sixteenth embodiment are carried out in a vacuum chamber. Hence, no void remains within the high thermal conductive member 105 and therefore, the electronic components 103 and 109 can be brought into coherent with the member 105 with reliability.

Seventeenth Embodiment

Figure 17:
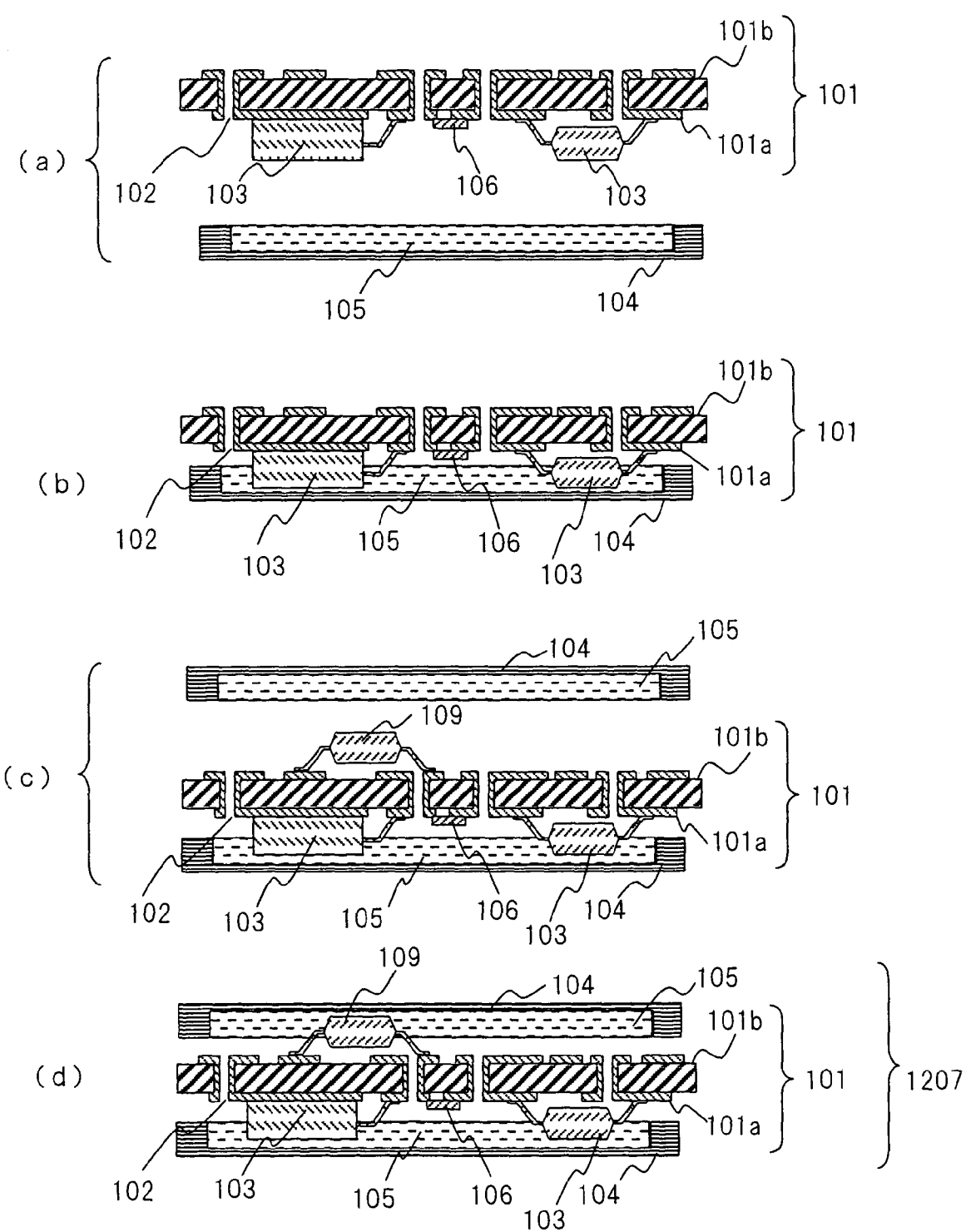
FIG. 17 is a sectional view by step showing a production method of a power module in accordance with a seventeenth embodiment of the present invention.

A production method of the power module 1207 shown in FIG. 12 will be described referring to FIG. 17. FIG. 17 is a process chart showing a production method of the power module 1207 shown in FIG. 12 in accordance with a seventeenth embodiment.

In a first step shown in FIG. 17(a), the electronic components requiring heat dissipation 103 and the electronic component 106 are mounted to one side of the multi-layer board 101.

Next, the heat sink 104 is formed so as to be recessed shape. The paste-like unhardened high thermal conductive member 105 formed of at least inorganic filler and thermosetting resin is produced. The production method of the unhardened high thermal conductive member 105 has been described in detail in the fifth embodiment. The paste-like unhardened high thermal conductive member 105 is filled in a depressed portion of the heat sink 104.

Alternatively, it is also possible that the sheet-like unhardened high thermal conductive member 105 is cut to be recessed shape and the member thus cut is filled in the depressed portion (a similar method as in FIG. 4 (the fourth embodiment)).

Next, in a second step shown in FIG. 17(b), the multi-layer board 101 and a heat sink 104 are laminated so that the side of the multi-layer board 101 to which the electronic components 103 are mounted is set as opposed to the high thermal conductive member 105 filled in the depressed portion of the heat sink 104. The high thermal conductive member 105 remains substantially uniform in thickness at the part to which the electronic components requiring heat dissipation 103 are not mounted. The high thermal conductive member 105 is hardened by use of a heating oven, thereby that the surfaces of the electronic components requiring heat dissipation 103 mounted to the multi-layer board 101 are coated with the high thermal conductive member 105 (embedded in the high thermal conductive member 105).

In a third step shown in FIG. 17(c), the electronic component requiring heat dissipation 109 is mounted to the side of the multi-layer board 101 to which the electronic components are mounted in the first step.

Next, the heat sink 104 is formed so as to be recessed shape. The paste-like unhardened high thermal conductive member 105 formed of at least inorganic filler and thermosetting resin is produced. The paste-like unhardened high thermal conductive member 105 is filled in a depressed portion of the heat sink 104.

Finally, the multi-layer board 101 and a heat sink 104 are laminated so that the side of the multi-layer board 101 to which the electronic components 109 is mounted is set as opposed to the high thermal conductive member 105 filled in the depressed portion of the heat sink 104. The high thermal conductive member 105 remains substantially uniform in thickness at the part to which the electronic component requiring heat dissipation 109 is not mounted. The high thermal conductive member 105 is hardened by use of a heating oven, thereby that the surfaces of the electronic component requiring heat dissipation 109 mounted to the multi-layer board 101 are coated with the high thermal conductive member 105 (embedded in the high thermal conductive member 105) to complete the power module 1207.

Eighteenth Embodiment

Figure 18:
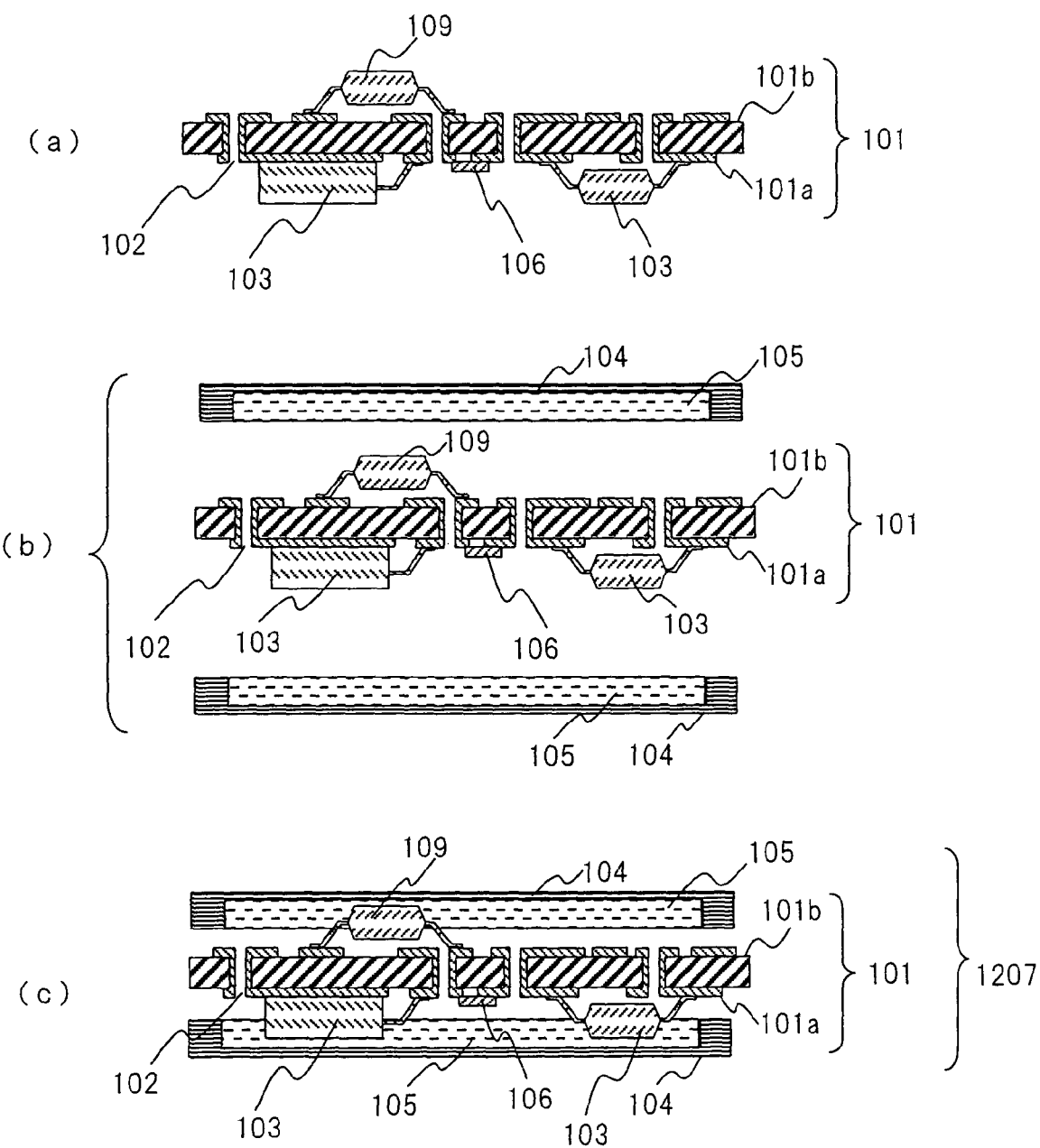
FIG. 18 is a sectional view by step showing a production method of a power module in accordance with an eighteenth embodiment of the present invention.
Figure 19:
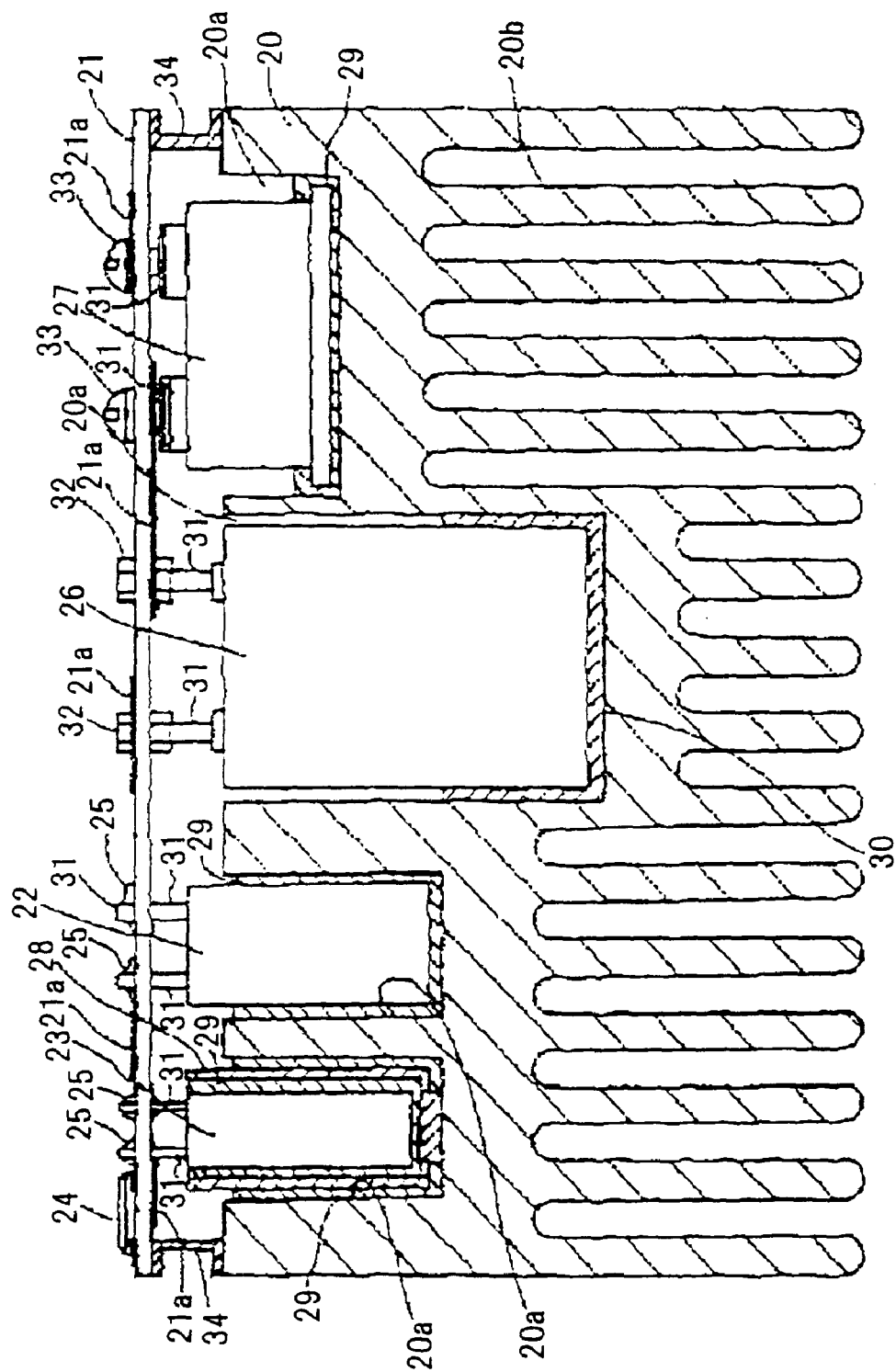
FIG. 19 is a sectional view of a circuit board in accordance with a conventional example.

A production method of the power module 1207 shown in FIG. 12 will be described referring to FIG. 18. FIG. 18 is a process chart showing a production method of the power module 1207 shown in FIG. 12 in accordance with a eighteenth embodiment.

Since a first step (FIG. 18(a)) and a second step (FIG. 18(b)) of the eighteenth embodiment are the same as the first step (FIG. 16(a)) and the second step (FIG. 16(b)) of the sixteenth embodiment, explanations thereof are omitted.

Next, in a third step shown in FIG. 18(c), the multi-layer board 101 and the heat sink 104 are disposed so that each side of the multi-layer board 101 faces to the high thermal conductive member 105 filled in the depressed portion of the heat sink 104. The high thermal conductive member 105 remains substantially uniform in thickness at the part to which the electronic components requiring heat dissipation 103 and 109 are not mounted. The high thermal conductive member 105 is hardened by use of a heating oven, thereby that the high thermal conductive member 105 coats the surfaces of the electronic components requiring heat dissipation 103 and 109 mounted to the multi-layer board 101 (or embeds part of the electronic components therein) to complete the power module 1207.

In the production method of the eighteenth embodiment, the heat sink 104 and the high thermal conductive member 105 are adhered to both sides of the multi-layer board 101 simultaneously. As the production method of this embodiment has less number of steps than the production method of the seventeenth embodiment, the power module 1007 of the twelfth embodiment can be produced at a lower cost.

All steps in the production method of the eighteenth embodiment are carried out at normal pressures. Since air in the voids within the unhardened member 105 comes out of the through hole 102 and space between the high thermal conductive member 105 and the multi-layer board 101, the electronic components 103 and 109 can be brought into coherent with the member 105 with reliability.

By producing the power module with the methods in accordance with the fourth to seventh embodiments and the thirteenth to eighteenth embodiment, heat generated from the electronic components 103 (or 103 and 109), each of which has an arbitrary different height, can be transferred to the heat sink 104 via the high thermal conductive member 105. Hence, the method of producing the power module with a good heat dissipation characteristic can be achieved.

Furthermore, by adhering the high thermal conductive member 105 to the heat sink 104 and unifying them, it is possible to reduce contact thermal resistance and to achieve the method of producing the power module with a good heat dissipation characteristic.

In the power module of the ninth to twelfth embodiment, needless to say, the electronic component 106 may be mounted to the side of the multi-layer board 101, to which the electronic component requiring heat dissipation 109, is mounted.

In the thirteenth to fifteenth embodiment, the paste-like unhardened high thermal conductive member 105 is printed to the heat sink 104 of uniform thickness so as to have a certain thickness, the heat sink 104 to which the high thermal conductive member 105 is printed is disposed on the side of the multi-layer board 101, to which the electronic component is mounted, and the laminated body is pressurized and heated. Alternatively, it is possible, of course, that the sheet-like high thermal conductive member 105 and the heat sink 104 are disposed on the side of the multi-layer board 101 to which the electronic component is mounted and the laminated body is pressurized and heated (the method in FIG. 4 (fourth embodiment)).

According to the present invention, the advantageous effect of achieving a power module that has a constitutional characteristics including good heat dissipation characteristic, high thermal resistance reliability, low cost and high productivity can be obtained.

According to the present invention, the advantageous effect of achieving a power module that efficiently takes heat occurring in the parts of various heights mounted to the circuit board by use of a multipurpose heat sink or a simple-shaped heat sink can be obtained.

According to the present invention, the advantageous effect of achieving a lightweight power module due to miniaturization and weight saving of heat radiating member.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

The invention claimed is:

1. A power module comprising:
   a circuit board including plural first devices and plural second devices mounted thereto, said circuit board and said plural first and second devices constituting an electric power conversion circuit, said plural first devices each having a high heating value,
   a heat sink, and
   a member having electrical insulation characteristics and high thermal conductivity, that is disposed between said plural first and second devices and said heat sink, said member having a first portion and a second portion, wherein said first portion of said member adheres to each of said plural first devices for transferring heat from said plural first devices to said heat sink, and wherein said second portion of said member is spaced from and not in contact with said plural first and second devices, and said circuit board and said member remaining substantially uniform in thickness at said second portion of said member.

2. A power module in accordance with claim 1, wherein said heat sink has a depressed portion and said member is filled in said depressed portion.

3. A power module in accordance with claim 1, wherein said member has thermosetting resin and inorganic filler as chief ingredients.

4. A power module in accordance with claim 1, wherein all of said plural first and second devices are short in height and mounted to a side of said circuit board that faces said heat sink.

5. A power module comprising:
   a circuit board having first and second surfaces, each said first and second surfaces including plural first devices and plural second devices mounted thereto, said circuit board and said plural first and second devices constituting an electric power conversion circuit, said plural first devices each having a high heating value;
   first and second heat sinks mounted on the first and second surfaces of said circuit board, respectively; and
   first and second members mounted on the first and second surfaces of said circuit board, respectively, each said member having electrical insulation characteristics and high thermal conductivity, each said member having a first portion and a second portion,
   wherein said first member is disposed between said plural first and second devices and said first heat sink, and said second member is disposed between said plural first and second devices and said second heat sink,
   wherein said first portion of said first member adheres to each of said plural first devices for transferring heat from said plural first devices to said first heat sink, said second portion of said first member is spaced from and not in contact with said plural first and second devices and said circuit board, and said first member remains substantially uniform in thickness at said second portion of said first member, and
   wherein said first portion of said second member adheres to each of said plural first devices for transferring heat from said plural first devices to said second heat sink, said second portion of said second member is spaced from and not in contact with said plural first and second devices and said circuit board, and said second member remains substantially uniform in thickness at said second portion of said second member.

* * * * *